(12) United States Patent
Schuster

(10) Patent No.: US 7,339,743 B2
(45) Date of Patent: Mar. 4, 2008

(54) VERY-HIGH APERTURE PROJECTION OBJECTIVE

(75) Inventor: Karl-Heinz Schuster, Koenigsbronn (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/528,379

(22) Filed: Sep. 28, 2006

(65) Prior Publication Data

US 2007/0019301 A1 Jan. 25, 2007

Related U.S. Application Data

(63) Continuation of application No. 10/931,062, filed on Sep. 1, 2004, now Pat. No. 7,154,676, which is a continuation-in-part of application No. 10/428,946, filed on May 5, 2003, now abandoned, and a continuation-in-part of application No. PCT/US03/06592, filed on Mar. 3, 2003.

(60) Provisional application No. 60/360,845, filed on Mar. 1, 2002.

(30) Foreign Application Priority Data

| May 3, 2002 | (WO) | ...................... PCT/EP02/04846 |
| May 24, 2002 | (DE) | ................................. 102 24 361 |

(51) Int. Cl.
*G02B 9/00* (2006.01)

(52) U.S. Cl. ....................... 359/649; 359/754

(58) Field of Classification Search ................ 359/649, 359/754
See application file for complete search history.

(56) References Cited

U.S. PATENT DOCUMENTS

| 4,506,958 A | 3/1985 | Imai |
| 5,059,006 A | 10/1991 | Kikuchi et al. |
| 5,260,832 A | 11/1993 | Togino et al. |
| 5,398,064 A | 3/1995 | Saka |
| 5,414,561 A | 5/1995 | Wakimoto et al. |
| 5,623,365 A | 4/1997 | Kuba |
| 5,636,000 A | 6/1997 | Ushida et al. |
| 5,696,631 A | 12/1997 | Hoffman |

(Continued)

FOREIGN PATENT DOCUMENTS

EP    537731 A1 * 4/1993

(Continued)

OTHER PUBLICATIONS

Bruning, John H. et al., "Optical Lithography—Thirty years and three orders of magnitude, The evolution of optical lithography tools", *SPIE*, vol. 3049, pp. 14-27 (1997).

*Primary Examiner*—Ricky Mack
*Assistant Examiner*—William C Choi
(74) *Attorney, Agent, or Firm*—Fish & Richardson P.C.

(57) ABSTRACT

A very-high aperture, purely refractive projection objective is designed as a two-belly system with an object-side belly, an image-side belly and a waist (7) situated therebetween. The system diaphragm (5) is seated in the image-side belly at a spacing in front of the image plane. Arranged between the waist and the system diaphragm in the region of divergent radiation is a negative group (LG5) which has an effective curvature with a concave side pointing towards the image plane. The system is distinguished by a high numerical aperture, low chromatic aberrations and compact, material-saving design.

35 Claims, 4 Drawing Sheets

U.S. PATENT DOCUMENTS

| | | |
|---|---|---|
| 5,856,884 A | 1/1999 | Mercado |
| 5,969,803 A | 10/1999 | Mercado |
| 5,986,824 A | 11/1999 | Mercado |
| 6,008,884 A * | 12/1999 | Yamaguchi et al. .......... 355/54 |
| 6,097,537 A | 8/2000 | Takahashi et al. |
| 6,349,005 B1 | 2/2002 | Schuster et al. |
| 6,556,353 B2 | 4/2003 | Omura |
| 6,560,031 B1 | 5/2003 | Shafer et al. |
| 6,700,645 B1 | 3/2004 | Shigematsu |
| 6,781,766 B2 * | 8/2004 | Takahashi .................. 359/649 |
| 6,791,761 B2 | 9/2004 | Shafer et al. |
| 6,930,837 B2 | 8/2005 | Shafer et al. |
| 2001/0050820 A1 | 12/2001 | Shafer et al. |
| 2002/0001141 A1 | 1/2002 | Shafer et al. |
| 2002/0005938 A1 | 1/2002 | Omura |
| 2002/0024741 A1 | 2/2002 | Terasawa et al. |

FOREIGN PATENT DOCUMENTS

| | | |
|---|---|---|
| EP | 0 816 892 | 1/1998 |
| EP | 1 061 396 A2 | 12/2000 |
| EP | 1 111 425 A2 | 6/2001 |
| EP | 1 235 092 | 8/2002 |
| EP | 1 237 043 | 9/2002 |
| EP | 1 245 984 | 10/2002 |
| GB | 1088192 | 10/1967 |
| JP | 10-282411 | 10/1998 |
| JP | 10-325922 | 12/1998 |
| JP | 11-006957 | 1/1999 |
| JP | 11-095095 | 4/1999 |
| JP | 11-214293 | 8/1999 |
| WO | WO 01/51979 A2 | 7/2001 |
| WO | WO 01/65296 A1 | 9/2001 |

* cited by examiner

VERY-HIGH APERTURE PROJECTION OBJECTIVE

CROSS-REFERENCE TO RELATED APPLICATIONS

The present application is a Continuation of application Ser. No. 10/931,062, filed Sep. 1, 2004 now U.S. Pat. No. 7,154,676, which is a Continuation-in-Part of U.S. application Ser. No. 10/428,946, filed on May 5, 2003 now abandoned, and of International Application PCT/US03/06592, with an international filing date of Mar. 3, 2003, which was published under PCT Article 21(2) in English; whereby the disclosures of each of these three applications are incorporated into this application by reference; the present application is further based on German Patent Application No. 102 24 361.1 filed on May 24, 2002, on International Patent Application PCT/EP02/04846 filed on May 3, 2002, and on U.S. Provisional Application 60/360,845 filed on Mar. 1, 2002, the three respective disclosures of which are also incorporated into this application by reference.

BACKGROUND OF THE INVENTION

1. Field of the Invention

The invention relates to a projection objective for projecting a pattern arranged in the object plane of the projection objective into the image plane of the projective objective with the aid of ultraviolet light of a prescribed operating wavelength.

2. Description of the Related Art

Photolithographic projection objectives have been in use for several decades for producing semiconductor components and other finely structured components. They serve the purpose of projecting patterns of photomasks or reticles, which are also denoted below as masks or reticles, onto an object, coated with a photosensitive layer, with a very high resolution on a reducing scale.

In order to generate ever finer structures of the order of magnitude of 100 nm or below, an attempt is being made to enlarge the image-side numerical aperture (NA) of the projection objectives beyond the values currently attainable into the range of NA=0.8 or above. Moreover, use is being made of ever shorter operating wavelengths of ultraviolet light, preferably wavelengths of less than 260 nm, for example 248 nm, 193 nm, 157 nm or below. At the same time, an attempt is being made to fulfil the increasing demands on the projectability with the aid of purely refractive, dioptric systems which are advantageous by comparison with catadioptric systems with regard to design and production. In the context of wavelengths which are becoming ever shorter, however, only a few sufficiently transparent materials, whose Abbe constants are relatively close to one another, are still available. This raises problems for a partial achromatization, and even more so with a complete achromatization of the projection objectives, that is to say the far-reaching avoidance or reduction of chromatic aberrations. In particular, it is difficult to provide very high aperture systems with adequate small chromatic aberrations. Furthermore, with rising aperture and an additional need for improved imaging qualities together with unchanged object and image fields there is an increase in the dimension of the projection objective in all three spatial directions. In particular, the increase in volume of the optical lens material increases the cost of such projection objectives disproportionately in relation to the gain in reducing structural width.

SUMMARY OF THE INVENTION

It is one object of the invention to provide a projection objective which is distinguished by a high image-side numerical aperture and improved chromatic correction. It is another object to permit a compact design which saves on material.

As a solution to these and other objects, this invention, according to one formulation, provides a projection objective for projecting a pattern arranged in the object plane of the projection objective into an image plane of the projection objective with the aid of ultraviolet light of a prescribed operating wavelength, the projection objective having:

a multiplicity of optical elements which are arranged along an optical axis; and a system diaphragm arranged at a distance in front of the image plane;

the projection objective being designed as a purely refractive single-waist system with a belly near the object, a belly near the image and a waist therebetween, and there being arranged in a region of divergent radiation between the waist and the system diaphragm a negative group which has an effective curvature with a concave side directed towards the image.

Advantageous developments are specified in the dependant claims. The wording of all the claims is incorporated in the content of the description by reference.

In accordance with one aspect of the invention, a projection objective for projecting a pattern arranged in the object plane of the projection objective into the image plane of the projection objective with the aid of ultraviolet light of a prescribed operating wavelength has a multiplicity of optical elements which are arranged along an optical axis, and a system diaphragm arranged at a spacing in front of the image plane. The projection objective is designed as a purely refractive (dioptric) single-waist system with a belly near the object, a belly near the image and a waist therebetween. In the region of the waist, the beam diameter can be essentially smaller than the maximum beam diameter in the region of one of the bellies, it being possible for the beam diameter in the waist region to be, for example, less than 50% of the maximum beam diameter. Arranged in a region of divergent radiation between the waist and the system diaphragm is a negative group which has an effective curvature with a concave side directed towards the image.

A "negative group" in this sense is a lens group with an overall negative refractive power, the lens group being able to comprise one or more lenses. The negative group is bent as a whole relative to the beam path as a result of the effective curvature. This curvature can be characterized by a surface of curvature whose centre of curvature is situated on the image side. The effective curvature of the lens (or of the surface of curvature) is characterized by a radius of curvature $r_c$ which is calculated as follows for a lens whose entry surface has the radius $r_1$ and whose exit surface has the radius $r_2$:

$$1/r_c = 1/(2 {}^* r_1) + 1/(2 {}^* r_2) \tag{1}$$

If the negative group comprises two or more lenses, the effective curvature of the group is calculated as follows:

$$1/r_c = 1/(n{}^* r_1) + 1/(n{}^* r_2) + 1/(n{}^* r_3) + 1/(n{}^* r_4) + \tag{2}$$

n specifying the number of surfaces.

Together with the divergence of the radiation in the region of the lenses, the effective curvature concave towards the image has the effect that high incidence angles occur particularly on the exit sides of the one or more lenses of the negative group. These are very effective above all for correcting aberrations of high order, in particular for aperture-dependent correction, (which act to overcorrect) of monochromatic aberrations in the image field zone and edge of the image field. The use of material for the projection objective must be minimized in order to produce the latter particularly economically. This is achieved firstly by the restriction to one waist and, secondly, by a constantly increasing field load of the system. The invention renders it possible for the first time to achieve an effective correction of all monochromatic aberrations with only one waist in conjunction with such a high field load. In the examples shown, the field load is already massively increased, but the limit is not yet reached. The possibilities for correcting the group in conjunction with a higher overall asphericity permit the expectation of a further rise in the field load, and thus a future reduction in costs for the lithographic projection objectives. It is clear here that the aperture of the projection objective and the field load of the objective could not be driven so high without the specific use of aspherics already set forth. Here, the negative group can create at least partially corrective functions such as would be possible otherwise only by providing a further waist. By contrast with such conventional three-belly systems, in the case of projection objectives according to the invention it is possible to achieve a substantial reduction in the overall length and diameter, and a reduction in the volume of material required for the production, and thus a substantial reduction in the overall price. The longitudinal chromatic aberration can be significantly reduced through the increase in the field load and the combination with only one waist. It is thereby possible, even in the case of a very high aperture, to dispense with use of $CaF_2$, for example at 193 nm, in the largest lenses around the diaphragm.

In a development, the negative group comprises at least one lens with negative refractive power and a concave surface directed towards the image. By splitting, the negative refractive power can also be distributed over a plurality of such, consecutive lenses of negative refractive power, the centers of curvature for the image-side exit surfaces being situated in each case on the image side. Here, a particularly material-saving, compact design is possible in the case of the use of only one or two such lenses of negative refractive power. If two lenses are lined up, it is advantageous when the refractive power of the first, object-side lens is greater than that of the subsequent, image-side lens of the group. These negative lenses can be configured as negative meniscus lenses.

It has proved to be advantageous when the negative group is arranged in a middle region between a site of narrowest constriction of the waist and the system diaphragm. Consequently, the negative group acts on ray bundles of average cross section and can have moderate diameters. Lenses with negative refractive power are naturally located in the region of the waist. Furthermore, there should be at least one large lens of negative refractive power for spherical correction in the region of the diaphragm. The negative group presented is particularly advantageous in the rising region of the second waist. Particularly at the centre of the waist, the lenses in the waist frequently have a bending which obeys the principle of minimum beam deflection in order to induce as few aberrations as possible. The task of the diverging lenses in the waist is firstly to deflect a convergent ray bundle into a divergent ray bundle. In conjunction with the large bellies, this permits the image field flattening of the system or the Petzval correction.

A further object consists in the skilful correction of contributory aberrations from the bellies with positive refractive power. The negative group in the first part of the second belly deviates fundamentally from the inner negative waist lenses with reference to the bending or curvature. The aim is not to transfer a ray bundle with balanced loads on entry and exit sides, but an intentionally asymmetric loading. Here, a "ray bundle" is a bundle of rays which originates or appears to originate from a single point or which converges or appears to converge towards a single point. The divergent ray bundle passes with moderate deflection into the lens in order then to exit again under extreme loading. This highly loaded surface permits the desired corrective action. The characterizing surfaces of curvature of the outlying negative lenses of the waist curve towards the centre of the waist. These outlying lenses advantageously "violate" the principle of minimal deflection. The object-side surface of the first negative waist lens and the image-side surface of the last waist lens have a particularly good effect on the aberration correction in conjunction with an increased angular load. The more important of these two waist lenses is that followed by the second belly. In the case of this lens, in turn, the image-side outer surface is the decisive surface, subjected to medium high loading. Without the advantageous negative group as presented in the rising region of the second waist, it would have to bear important components of the correction of the aberration correction as a function of field and aperture. However, given increasing loading of aperture and field impermissible zonal contributions with reference to field and aperture are left over for inclined ray bundles despite massive aspherization.

This problem is solved by the negative group in the rising region of the second waist, specifically with the aid of a suitable tuning of the average angular load at the exit surface of the last waist lens with average ray bundle variation, and of the high angular load of the exit surface or exit surfaces of the negative lens or lenses in the rising region of the second waist with low ray bundle variation. The corrective contributions for the inclined spherical aberrations then complement each other fittingly such that it is possible to achieve the highest field loadings and highest apertures, such as NA=0.95, in conjunction with the smallest wavefront deviation.

Suitable relationships can be implemented, in particular, when the condition:

$$A/B > C/D$$

holds for the parameters:

A=maximum angular loading in gas of the image-side exit surface of a lens of the negative group in the rising region of the second belly, in degrees;

B=maximum angular loading in gas of the image-side exit surface of the last lens with negative refractive power in the objective waist, in degrees;

C=ratio of marginal beam height of A to the maximum coma beam height of A;

D=ratio of marginal beam height of B to the maximum coma beam height of B.

The angular loading can be quantified, for example, by the corresponding maximum incidence angles of the radiation (in gas).

The characterizing surfaces of curvature of the negative group in the first part of the second belly curve towards the image. The vertex of the overall characterizing surface of curvature of the negative group should be in a range between approximately 30% and approximately 70%, in particular between approximately 40% and approximately 60% of the axial spacing between the region of narrowest constriction of the waist and the system diaphragm.

The effective curvature of the negative group can be adapted to optimize the system properties. Preferably, the effective curvature has a radius of curvature $r_c$ whose ratio $r_c/DB$ to the aperature diameter DB is in the range between approximately 0.8 and approximately 2.2, preferably in the range between approximately 1.0 and approximately 2.0, in particular in the range between approximately 1.1 and approximately 1.9.

In the case of preferred embodiments, in the region of the system diaphragm the projection objective has, with reference to a plane of symmetry perpendicular to the optical axis, an essentially symmetrical design with biconvex positive lenses and negative meniscus lenses. This essentially symmetrical design permits a good correction state to be attained in conjunction with a low overall asphericity even given large apertures. The plane of symmetry is preferably situated near the system diaphragm. It is possible to depart from this symmetrical design in the direction of building up or increasing refractive power of the negative lens behind the diaphragm, and of decreasing the refractive power of the negative lens in front of the diaphragm. It is possible by means of this symmetrical arrangement to manage with a low outlay on aspherization. If the facilities for testing and producing more complex and stronger asphericities are improved, the symmetry can be modified at the expense of the negative lens in front of the diaphragm, that is to say lower refractive power or substitution by asphericity in the overall system. The large negative lens after the diaphragm should always have the same alignment of the effective curvature as the curvature already represented for the negative group in the rising region between waist and system diaphragm.

The system diaphragm within the meaning of this application is the region closer to the image plane in which either the main beam of the projection intersects the optical axis, or sites are present at which the height of a coma beam corresponds to the height of an marginal beam. A diaphragm (aperture diaphragm) for limiting and, if appropriate, adjusting the aperture used can be arranged in the region of the system diaphragm. The invention renders it possible to achieve an effective correction of all aberrations with only one waist. The negative group can take over at least partially in this case the function of a second waist such as is present in conventional three-belly systems. By contrast with such three-belly systems, it is possible in the case of projection objectives according to the invention to achieve a substantial reduction in the overall length, a reduction in the volume of material required for production, and a reduction in the chromatic aberrations.

It has proved to be advantageous when a negative meniscus lens with an object-side concave surface is arranged immediately in front of the system diaphragm, and a negative meniscus lens with an image-side concave surface is arranged immediately behind the system diaphragm. The system diaphragm can be freely accessible between these, in order, for example, to fit an adjustable diaphragm for limiting the beam diameter. This diaphragm can additionally be moved axially during opening and closing. An advantageous refinement is also provided by spherical diaphragms in conjunction with these single-waist systems, since the diaphragm curvature of preferred embodiments can still be used therefor.

The symmetry can continue far into the object-side and image-side near zones of the system diaphragm. For example, a positive/negative doublet with an object-side biconvex lens and a subsequent negative meniscus lens with an object-side concave surface can be arranged immediately in front of the system diaphragm, and a doublet design in mirror-image fashion relative thereto can be arranged behind the system diaphragm. The doublets are further framed by biconvex lenses on the object side and image side, respectively, in some embodiments.

The systems can be designed such that all the transparent optical elements are produced from the same material. This holds, in particular, for 248 nm, a pure quartz glass solution being advisable in technical terms. In the case of an embodiment designed for an operating wavelength of 193 nm, synthetic quartz glass suitable for 193 nm is also used for all the lenses. However, one or more lenses near the image or lenses of increased loading in terms of radiation and setting (dipole, quadrupole for a low sigma) can consist of another material, for example $CaF_2$. Embodiments for 157 nm, in the case of which all the lenses consist of calcium fluoride or are combined with another fluoride crystal material, are possible. Also possible are combinations of a plurality of different materials, for example in order to facilitate the correction of chromatic aberrations, or to reduce compaction or lens heating. For example, for 193 nm the synthetic quartz glass can be replaced by a crystal material, for example calcium fluoride, in the case of some or all the lenses.

Very-high aperture projection objectives, in particular also purely refractive projection objectives, for which the image-side numerical aperture is $NA \geq 0.85$ are possible within the scope of the invention. The said aperture is preferably at least 0.9.

Preferred projection objectives are distinguished by a number of advantageous design and optical features which are conducive alone or in combination with one another for suiting the objective for ultra-fine microlithography.

At least one aspheric surface is preferably arranged in the region of the system diaphragm. It is preferred for a plurality of surfaces with aspherics to come in close succession behind the diaphragm. It can be advantageous, furthermore, when the last optical surface in front of the system diaphragm and the first optical surface after the system diaphragm are aspheric. Here, opposite aspheric surfaces with a curvature pointing away from the diaphragm can be provided, in particular. The high number of aspheric surfaces in the region of the system diaphragm is advantageous for the correction of the spherical aberration, and has an advantageous effect on the setting of the isoplanatism.

Furthermore, it can be advantageous when at least one positive meniscus lens with an object-side concave surface is arranged between the waist and the system diaphragm in the vicinity of the waist. Instead of one such meniscus lens, it is possible to provide a plurality, for example two, consecutive lenses of this type.

Particularly advantageous are embodiments in which the effective curvature changes, at least between two lenses, between waist and system diaphragm in this order, the effective curvature of the first lens being on the object side, and the effective curvature of the lens directly subsequent being on the image side. Preferably, in each case two consecutive positive lenses of the respective curvatures are provided. A change in the position of the centers of curvature of the effective curvature therefore takes place in the region between these lenses or lens groups.

It is preferred for a plurality of negative lenses to be arranged consecutively in the region of the waist, there being at least two, preferably three negative lenses in preferred embodiments. The said lenses bear the main load of the Petzval correction and a portion of the correction of the inclined ray bundles.

At least two negative lenses are advantageous at the object-side input of the system during entry into the first belly, in order to widen the beam coming from the object. Three or more such negative lenses are preferred. It is advantageous in the case of high input apertures when at least one aspheric surface is provided on at least one of the first lenses. Each of the input-side negative lenses preferably has at least one aspheric surface.

It is advantageous independently of the refractive power of the lenses when aspherization takes place on the wafer side on the first two lenses in each case given a single-waist objective. The closer the first aspheric is situated to the reticle, the higher is the ray bundle separation, and the more effective is the aspherization. The aspheric on the front side of the second lens is then also still very close to the reticle, but already has quite different ray bundle cross sections such that the pair of aspherics can ideally complement one another and act optimally over and above this. It may be mentioned as a precaution, however, that the ray bundle cross sections are particularly small, resulting in the need to produce particularly smooth aspheric lenses.

A lens group with a strong positive refractive power which constitutes the first belly in the beam guidance preferably follows behind this input group. Particularly advantageous are embodiments in which the effective curvature changes between reticle and waist, at least between two lenses, the effective curvature of the first lens being situated on the object side, and the effective curvature of the directly following lens being situated on the image side. Two consecutive positive lenses of the respective curvatures are preferably provided in each case. Thus, a change in the position of the centers of curvature of the effective curvature takes place in the region between these lenses or lens groups. At least one meniscus lens with positive refractive power and image-side concave surfaces can be advantageous in this group in the region of still great beam heights in the near zone of the object plane, since the said meniscus lens contributes to the Petzval relief of the objective.

The previous and other properties can be seen not only in the claims but also in the description and the drawings, wherein individual characteristics may be used either alone or in sub-combinations as an embodiment of the invention and in other areas and may individually represent advantageous and patentable embodiments.

DETAILED DESCRIPTION OF THE PREFERRED EMBODIMENTS

In the following description of the preferred embodiment, the term "optical axis" denotes a straight line through the centers of curvature of the spherical optical components or through the axes of symmetry of aspheric elements. Directions and distances are described as on the image side, on the wafer side or towards the image when they are directed in the direction of the image plane or the substrate which is located there and is to be exposed, and as on the object side, on the reticle side or towards the object when they are directed towards the object with reference to the optical axis. In the examples, the object is a mask (reticle) with the pattern of an integrated circuit, but another pattern, for example a grating, can also be involved. In the examples, the image is formed on a wafer serving as substrate and provided with a photoresist layer, but other substrates are also possible, for example elements for liquid crystal displays or substrates for optical gratings.

Figure 1:
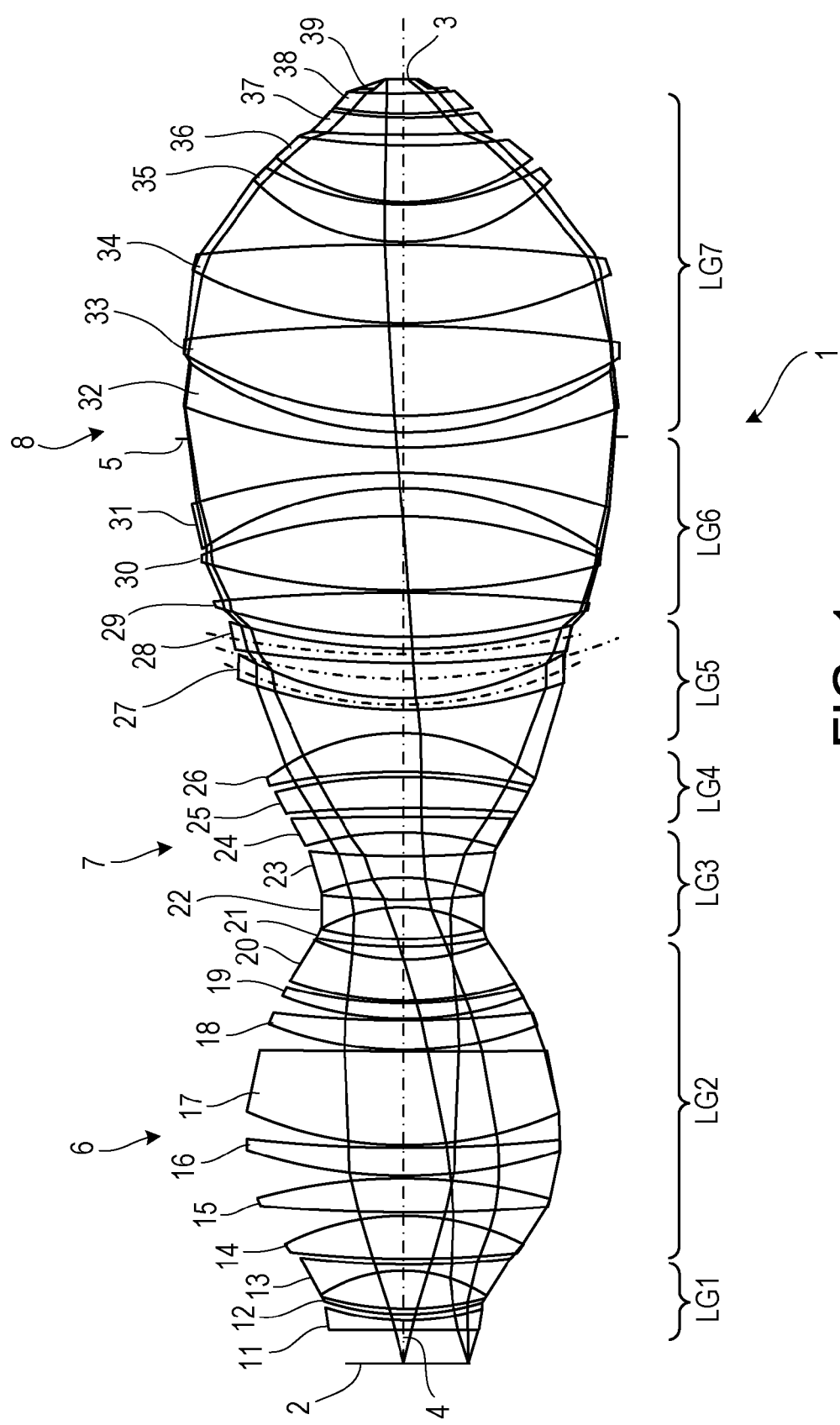
FIG. 1 is a lens section through an embodiment of a refractive projection objective which is designed for an operating wavelength of 193 nm.

FIG. 1 shows a characteristic design of an inventive, purely refractive reduction objective 1. It serves the purpose of projecting a pattern, arranged in an object plane 2, of a reticle or the like into an image plane 3, conjugate with the object plane, to a reduced scale without instances of obscuration or shading in the image field, for example to the scale of 4:1. This is a rotational symmetrical single-waist system whose lenses are arranged along an optical axis 4, which is perpendicular to the object plane and image plane, and form an object-side belly 6, an image-side belly 8 and a waist 7 situated therebetween. The system diaphragm 5 is situated in the region, near the image, of large beam diameters.

The lenses can be subdivided into a plurality of consecutive lens groups with specific properties and functions. A first lens group LG1, following the object plane 2, at the input of the projection objective has a negative refractive power overall, and serves to expand the beam coming from the object field. A subsequent second lens group LG5 with a positive refractive power overall forms the first belly 6 and recombines the beam in front of the following waist 7. A third lens group LG3 with a negative refractive power is located in the region of the waist 7. The said third lens group is followed by a fourth lens group LG4, consisting of positive meniscus lenses, with a positive refractive power, which is followed by a fifth lens group LG5, consisting of negative meniscus lenses, with a negative refractive power. The subsequent lens group LG6 with a positive refractive power guides the radiation to the system diaphragm 5. Situated behind the latter is the seventh and last lens group LG7, which consists predominantly of individual lenses with a positive refractive power and makes the main contribution to the production of the very high image-side numerical aperture of NA=0.93.

The first lens group LG1 opens with three negative lenses 11, 12, 13 which comprise, in this order, a negative lens 11 with an aspheric entry side, a negative meniscus lens 12 with an image-side centre of curvature and an aspheric entry side, and a negative meniscus lens 13 with an object-side centre of curvature and an aspheric exit side. Given the high input aperture present, at least one aspheric surface should be provided on at least one of the first two lenses 11, 12, in order to limit the production of aberrations in this region. As in the present example, a (at least one) aspheric surface is preferably provided at each of the three negative lenses.

With a slight air separation behind the last lens 13 of the first lens group LG1, the second lens group LG2 has a biconvex positive lens 14, a further biconvex positive lens 15, a positive meniscus lens 16 with an image-side centre of curvature, a further positive lens 17 with a virtually flat exit side, a positive meniscus lens 18 with an image-side centre of curvature of the surfaces, and three further meniscus lenses 19, 20, 21 of the same direction of curvature. The entry side of the lens 15 and the exit side, reaching to the waist, of the last meniscus lens 21 are aspheric. An aspheric is therefore present in the region of the waist. This second lens group LG2 constitutes the first belly 6 of the objective.

A particular feature is formed by the positive meniscus lens 16 which is arranged at the greatest diameter and whose centers of curvature are situated on the image side. This lens group serves the purpose, chiefly, of the Petzval correction, the distortion and telecentring correction and the field correction outside the main sections.

The third lens group LG3 consists of three negative meniscus lenses 22, 23, 24 whose boundary surfaces are spherical in each case. This lens group bears the main load of the correction of the field curvature and is fashioned such that despite the high system aperture of NA=0.93 the maximum incidence angles of the beams striking the lens surfaces are below approximately 60° or the sine of the incidence angles is below 0.85 in each case. The first negative lens 22 of the third group is preferably a strongly biconcave lens such that the main waist 7 opens with strongly curved surfaces.

The fourth lens group LG4, following the waist 7, consists of two positive meniscus lenses 24, 25 with object-side concave surfaces, the exit side of the input-side meniscus lens 24 being aspheric, and the remaining surfaces being spherical. In the case of other embodiments, it is also possible to provide at this point only a single positive meniscus of appropriate curvature.

The subsequent fifth lens group LG5 likewise has two meniscus lenses 27, 28, but these each have a negative refractive power, and the concave surfaces are directed towards the image field 3. If appropriate, it is also possible to provide at this point only one negative meniscus whose centre of curvature is situated on the wafer side. Such a group with at least one lens with a negative refractive power is a central correction element for the functioning of the single-waist system, in order to correct off-axis aberrations elegantly. In particular, this permits a compact design with relatively small lens diameters.

Because of the overall negative refractive power, the fifth lens group LG5 is also denoted here as a negative group. Each of the negative meniscus lenses 27, 28 can be characterized by a surface of curvature marked by dashes, which runs centrally between the entry and exit surfaces and whose radius $r_c$ can be calculated in accordance with Equation (1). Just like the surfaces of curvature of the individual lenses 27, 28, the surface of curvature of the overall negative group LG5, which is shown by dots and dashes and can be calculated in accordance with Equation (2), has a concave side directed towards the image surface 3 or a centre of curvature situated on the image side. It is situated centrally between the surfaces of curvature of the individual lenses 27, 28. The negative group is arranged approximately in the middle between the region of narrowest constriction of the waist 7 and the system diaphragm 5 in the region of diverging beams. Because of the curvature directed against the beam path, there occur at the exit surfaces of the two negative meniscus lenses, in particular at the exit surface of the first meniscus 27, high incidence angles of the emerging radiation which have a strong corrective action, in particular for the monochromatic aberrations depending strongly on field and pupil. In the case of other embodiments, a single negative lens with a surface of curvature concave towards the image can also be provided at this point. Negative groups with three or more lenses are also possible. It is not necessary for each of the lenses to be a negative lens when there are several lenses, as long as an overall negative refractive power results. Both excessively strong and excessively weak curvatures of the surface of curvature should be avoided, in order to permit a compromise between optimal corrective action and large incidence angles which can be mastered by production engineering. The ratio between the radius $r_c$ of the surface of curvature, shown by dots and dashes, of the lens group LG5 and the diaphragm diameter should be between approximately 0.8 and 2.2, and is approximately 1.035 in this embodiment (overall value).

It is particularly important, furthermore, that a change in the position of the centers of curvature between meniscuses of the fourth lens group LG4 and the lenses of the fifth lens group LG5 takes place in the input region, following the waist 7, of the second belly 8. It is possible to achieve thereby that inclined spherical aberration in the case of an extreme aperture can be smoothed.

The sixth lens group LG6 begins with a sequence of biconvex positive lenses 29, 30. Their collecting action is compensated again by a subsequent, strongly curved negative meniscus 31. This negative meniscus in front of the diaphragm 5 is bent towards the diaphragm, and therefore has a concave surface on the object side. The corresponding counterpart is seated immediately behind the diaphragm. This negative meniscus 32 is likewise curved towards the diaphragm and has a concave surface on the image side. It is followed by two large biconvex positive lenses 33, 34 with the largest diameter. Following thereupon are two positive meniscus lenses 35, 36 concave towards the image plane, a weakly negative meniscus lens 37, a weakly positive lens with a weakly curved entry side and a virtually flat exit side, and by a plane-parallel end plate 39.

The design of the second belly, which is relatively elongated and widens slowly from the waist to the largest diameter, is constructed in the region of the system diaphragm 5 in a fashion essentially symmetrical in relation to a plane of symmetry which runs perpendicular to the optical axis and is situated in the vicinity of the system diaphragm. Corresponding in a virtually mirror-image fashion in this case are the negative meniscus lenses 31, 32, the positive lenses 30, 33 enclosing the latter, and the biconvex lenses 29 and 34 arranged outside these doublets. The central region of the second belly around the diaphragm therefore contains as positive lenses only biconvex lenses, and as negative lenses only curved meniscuses. A meniscus-shaped air clearance is formed in each case in the doublets 30, 32 and 32, 33, respectively.

The first belly contains a weakly positive meniscus lens 19 in the decreasing region. With the subsequent, thicker meniscus lens 20, this forms a strongly curved air clearance open towards the outside. In the air clearance following thereupon, there is an air meniscus which is less curved and is closed towards the outside. An improved shell tuning in the sagittal and tangential sections is thereby possible. It is also possible thereby at the same time to keep angular loading in the region of the concave entry surface of the negative lens 22 below the aperture loading. The Petzval correction is performed substantially by the lenses in the waist region in conjunction with the large bellies. A single waist suffices, nevertheless. Good centring is to be ensured in particular in the case of the lens 27, curved towards the image, of negative refractive power of the fifth lens group, since a slight decentring would immediately supply coma contributions on the highly loaded exit surface.

The specification of the design is summarized in a known way in tabular form in Table 1. Here, column 1 gives the number of a refracting surface, or one distinguished in another way, column 2 gives the radius r of the surface (in mm), column 3 gives the distance d denoted as thickness, of the surface from the following surface (in mm), column 4 gives the material of the optical components, and column 5 gives the refractive index of the material of the component, which follows the entry surface. The useful, free radii or half the free diameter of the lenses (in mm) are specified in column 6.

In the case of the embodiment, twelve of the surfaces, specifically the surfaces 2, 4, 7, 10, 23, 31, 36, 41, 43, 45, 48 and 50 are aspheric. Table 2 specifies the corresponding aspheric data, the aspheric surfaces being calculated using the following rule:

$$p(h)=[((1/r)h^2)/(1+SQRT(1-(1+K)(1/r)^2h^2))]+C1*h^4+C2*h^6+$$

Here, the reciprocal (1/r) of the radius specifies the surface curvature, and h the distance of a surface point from the optical axis. Consequently, p(h) gives the so-called sagitta, that is to say the distance of the surface point from the surface apex in the z direction, that is to say in the direction of the optical axis. The constants K, C1, C2, . . . are reproduced in Table 2.

The optical system 1, which can be reproduced with the aid of these data, is designed for an operating wavelength of approximately 193 nm, for which the synthetic quartz glass used for all the lenses has a refractive index n=1.56029. The image-side numerical aperture is 0.93. The objective has an overall length (distance between image plane and object plane) of 1342 mm, and the field size is 10.5*26.0 mm.

A projection objective is thereby created which operates at an operating wavelength of 193 nm, can be produced with the aid of conventional techniques for the lens production and coatings, and permits a resolution of structures far below 100 nm and is very well corrected. This becomes clear from low values of transverse aberration and a wavefront RMS value of at most 3.3 mλ at 193 nm over all image heights.

Figure 2:
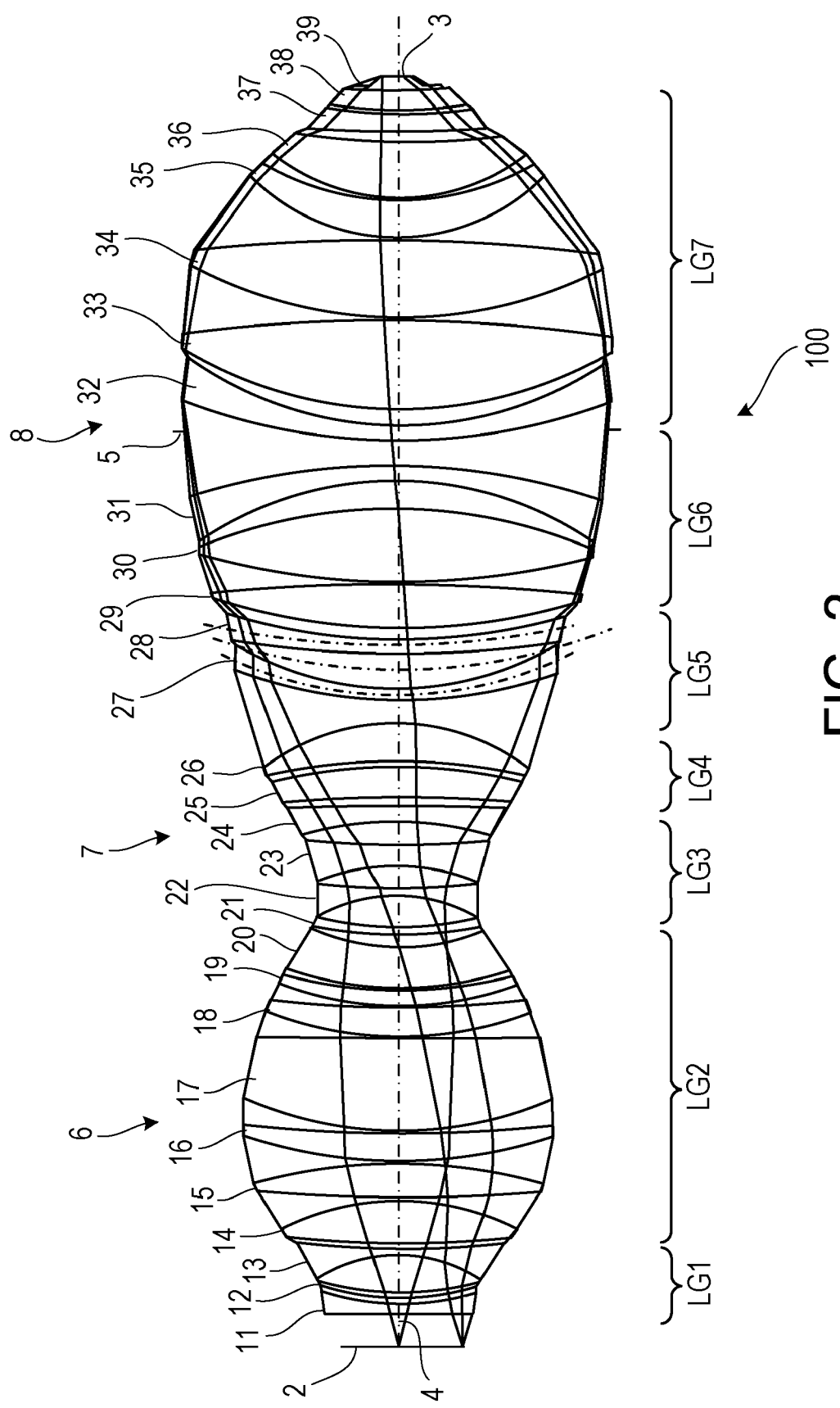
FIG. 2 is a lens section through an embodiment of a refractive projection objective which is designed for an operating wavelength of 157 nm.

Another embodiment, which is designed for an operating wavelength of 157 nm and is constructed exclusively from calcium fluoride components is explained with the aid of FIG. 2 and Tables 3 and 4. The type and sequence of the lenses corresponds to the embodiment in accordance with FIG. 1. The mutually corresponding lenses and lens groups are therefore denoted by the same reference symbols. With an overall length of 1 000 µm, the objective 100 is somewhat more compact and has a numerical aperture of 0.93 and a field size of 12*17 mm. A maximum wavefront RMS value of 3 mk over all image heights substantiates an outstanding correction state of the objective. The example shows that the basic principles of the invention can easily be transferred to objectives for other wavelengths.

Figure 3:
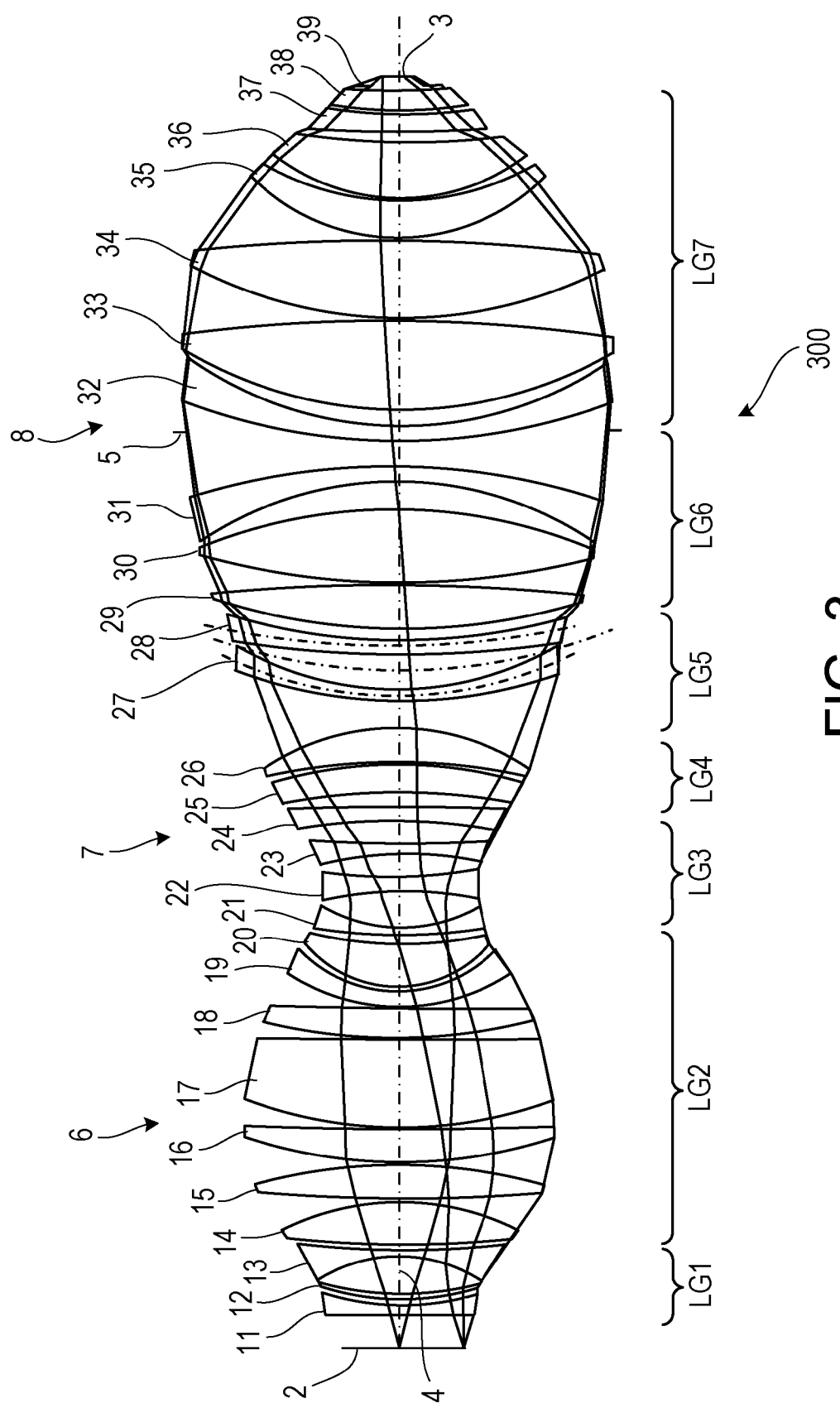
FIG. 3 is a lens section through an embodiment of a refractive projection objective which is designed for an operating wavelength of 193 nm.

A further embodiment 300, which is designed for an operating wavelength of 193 nm is explained with the aid of FIG. 3 and Tables 5 and 6. All the lenses consist of the synthetic quartz glass, with the exception of the penultimate lens 38 near the image plane 3. The positive lens 38 consists of calcium fluoride and has a positive effect on transverse chromatic aberrations, while at the same time few undesired longitudinal chromatic aberrations are produced. The type and sequence of the lenses corresponds essentially to the embodiment in accordance with FIG. 1, the difference with respect to the latter being that the positive meniscus lens 36 there, which is concave towards the image, is split here in two positive meniscus lenses 36, 36' with the same sense of curvature. The lenses and lens groups corresponding to one another are denoted by the same reference symbols. The objective 300 has an overall length of 1 250 mm, an numerical aperture of NA=0.9, and a field size of 10.5×26 mm. The maximum wavefront RMS value is between 5 and 6 mλ.

Figure 4:
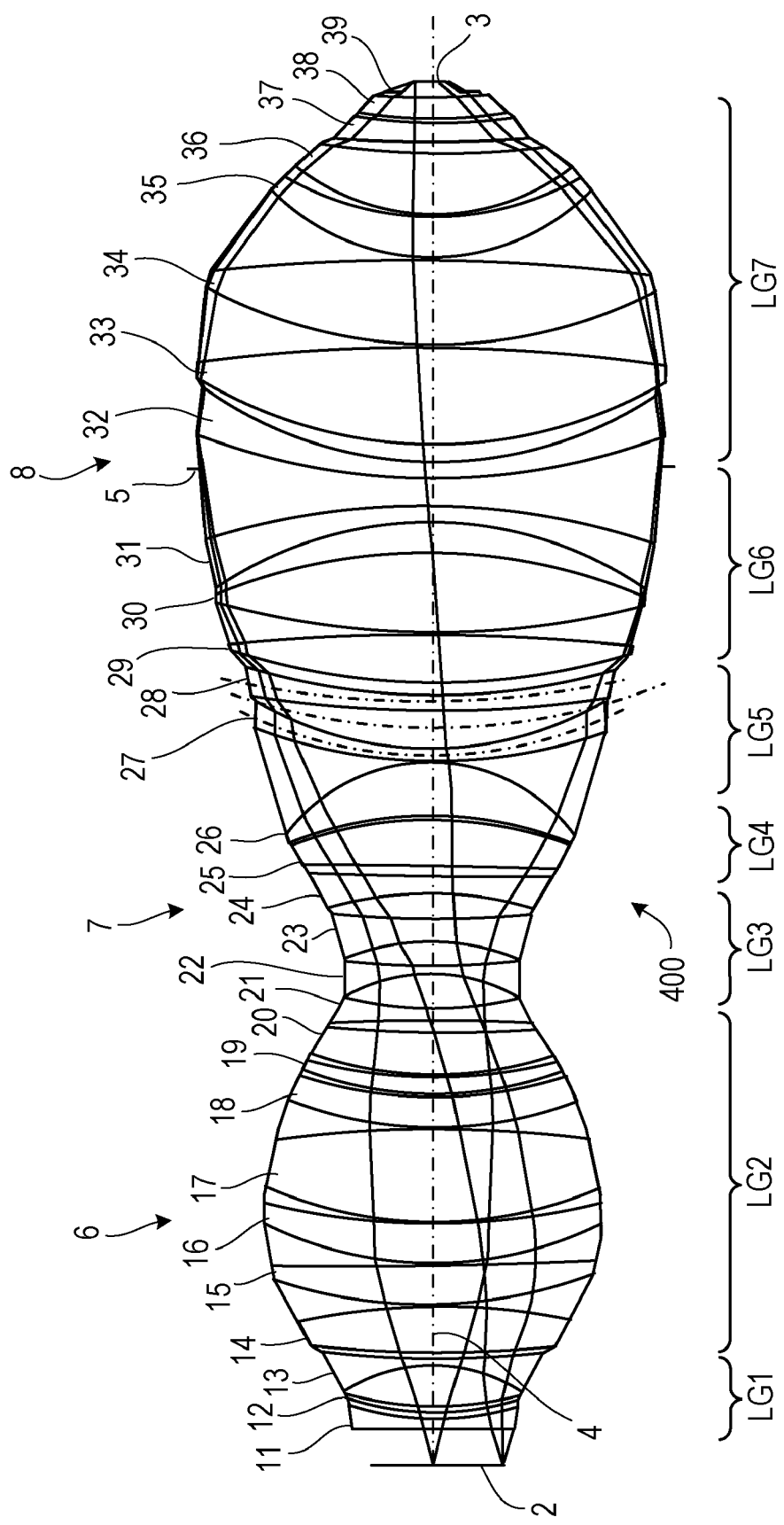
FIG. 4 is a lens section through an embodiment of a refractive projection objective which is designed for an operating wavelength of 157 nm.

Another embodiment, designed for an operating wavelength of 157 nm, of a projection objective 400 in the case of which all the lenses consist of calcium fluoride is explained with the aid of FIG. 4 and Tables 7 and 8. The crystallographic <111> axes of most or all of the lenses are situated in this case substantially parallel to the optical axis. The type and sequence of the lenses corresponds largely to the embodiment in accordance with FIG. 1, for which reason mutually corresponding lenses and lens groups are denoted by the same reference symbols. A numerical aperture of NA=0.95 is achieved given an overall length of approximately 1 069 mm and a field size of 6.0×22 mm. A maximum wavefront RMS value of approximately 2.6 mλ over all image heights substantiates an outstanding correction state of the objective. The lenses 13, 15, 16, 18, 21, 24, 26, 28, 30, 33, 35 and 36 are each rotated by 60° about the optical axis by comparison with the remaining lenses, in order to achieve a correction of birefringence effects which can be caused by the intrinsic birefringence of calcium fluoride. These measures can also be provided in the case of the embodiment in accordance with FIG. 2. The design data of a comparable projection objective with NA=0.95 which is calculated for an operating wavelength of 193 nm are specified in Tables 9 and 10. If embodiments with <100>-orientated crystal lenses are provided, these are always mixed with <111>-orientated lenses. The relative rotation of <100> lenses which is suitable for compensation is approximately 45°, whereas for <111> lenses it is approximately 60°. It is basically possible to achieve good compensation whenever lenses with comparable optical paths and comparable incidence angles inside the material are rotated counter to one another in a pairwise and planned way.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

TABLE 1

(Shs2003)

| SURFACE | RADII | THICKNESSES | GLASSES | REFRACTIVE INDEX 193.304 nm | ½ FREE DIAMETER |
|---|---|---|---|---|---|
| 0 | 0.000000000 | 33.600000000 | L710 | 0.99998200 | 56.080 |
| 1 | 0.000000000 | 2.116348742 | L710 | 0.99998200 | 64.111 |
| 2 | 543769.142501049AS | 8.000000000 | SIO2HL | 1.56028895 | 64.830 |
| 3 | 161.642131585 | 4.159723042 | HE193 | 0.99971200 | 67.531 |
| 4 | 218.691761237AS | 8.400000000 | SIO2HL | 1.56028895 | 69.959 |
| 5 | 219.026045883 | 37.232327077 | HE193 | 0.99971200 | 70.564 |
| 6 | −126.273541233 | 9.059812069 | SIO2HL | 1.56028895 | 71.879 |
| 7 | 590.000664984AS | 5.888594676 | HE193 | 0.99971200 | 91.812 |
| 8 | 874.341541676 | 45.211384116 | SIO2HL | 1.56028895 | 98.202 |

TABLE 1-continued (Shs2003)

| SURFACE | RADII | THICKNESSES | GLASSES | REFRACTIVE INDEX 193.304 nm | ½ FREE DIAMETER |
|---|---|---|---|---|---|
| 9 | −198.096216449 | 0.750325389 | HE193 | 0.99971200 | 103.786 |
| 10 | 946.848097810AS | 38.538214934 | SIO2HL | 1.56028895 | 123.489 |
| 11 | −425.263923111 | 1.158522801 | HE193 | 0.99971200 | 125.869 |
| 12 | 350.163434277 | 30.488033825 | SIO2HL | 1.56028895 | 134.676 |
| 13 | 1009.701801617 | 1.197549469 | HE193 | 0.99971200 | 134.221 |
| 14 | 286.135356357 | 98.148093037 | SIO2HL | 1.56028895 | 134.698 |
| 15 | 19301.429695110 | 0.700000000 | HE193 | 0.99971200 | 123.374 |
| 16 | 272.045958073 | 31.009665217 | SIO2HL | 1.56028895 | 116.140 |
| 17 | 737.805495222 | 0.700000000 | HE193 | 0.99971200 | 111.526 |
| 18 | 250.056020156 | 17.945571560 | SIO2HL | 1.56028895 | 104.536 |
| 19 | 331.911514310 | 0.700000000 | HE193 | 0.99971200 | 99.743 |
| 20 | 254.183348934 | 45.167991817 | SIO2HL | 1.56028895 | 97.168 |
| 21 | 168.278221248 | 12.633486164 | HE193 | 0.99971200 | 75.317 |
| 22 | 333.410550457 | 8.000000000 | SIO2HL | 1.56028895 | 73.766 |
| 23 | 305.673163674AS | 33.620359548 | HE193 | 0.99971200 | 69.745 |
| 24 | −126.882359261 | 8.400000000 | SIO2HL | 1.56028895 | 68.517 |
| 25 | 623.561065898 | 22.920166250 | HE193 | 0.99971200 | 69.269 |
| 26 | −159.640135295 | 21.959811493 | SIO2HL | 1.56028895 | 69.579 |
| 27 | 612.121329616 | 25.136797688 | HE193 | 0.99971200 | 79.613 |
| 28 | −256.899270677 | 16.106811172 | SIO2HL | 1.56028895 | 82.648 |
| 29 | −6721.059689803 | 10.198456701 | HE193 | 0.99971200 | 95.151 |
| 30 | −759.091077253 | 33.505555154 | SIO2HL | 1.56028895 | 98.551 |
| 31 | −373.512212393AS | 2.955259188 | HE193 | 0.99971200 | 110.248 |
| 32 | −482.275268598 | 42.142366706 | SIO2HL | 1.56028895 | 113.540 |
| 33 | −167.944569801 | 24.912342267 | HE193 | 0.99971200 | 117.230 |
| 34 | 352.644000465 | 12.417917014 | SIO2HL | 1.56028895 | 140.307 |
| 35 | 239.800147366 | 38.495163859 | HE193 | 0.99971200 | 139.720 |
| 36 | 919.430222419AS | 12.380604737 | SIO2HL | 1.56028895 | 142.518 |
| 37 | 415.408472297 | 13.298822306 | HE193 | 0.99971200 | 148.485 |
| 38 | 448.474261455 | 47.786431536 | SIO2HL | 1.56028895 | 160.368 |
| 39 | −1304.870981174 | 0.700000000 | HE193 | 0.99971200 | 162.101 |
| 40 | 549.477937127 | 77.507833077 | SIO2HL | 1.56028895 | 175.924 |
| 41 | −411.968607019AS | 30.091104049 | HE193 | 0.99971200 | 176.606 |
| 42 | −264.054542030 | 15.750000000 | SIO2HL | 1.56028895 | 176.112 |
| 43 | −528.210359924AS | 37.000000000 | HE193 | 0.99971200 | 186.586 |
| 44 | 0.000000000 | −10.000000000 | HE193 | 0.99971200 | 183.991 |
| 45 | 435.061723432AS | 15.750000000 | SIO2HL | 1.56028895 | 198.802 |
| 46 | 280.349256994 | 17.105701219 | HE193 | 0.99971200 | 193.492 |
| 47 | 322.068458373 | 94.193714724 | SIO2HL | 1.56028895 | 197.207 |
| 48 | −987.718496827AS | 1.636340795 | HE193 | 0.99971200 | 196.856 |
| 49 | 335.441022838 | 82.947217201 | SIO2HL | 1.56028895 | 188.622 |
| 50 | −1114.388548306AS | 1.270418444 | HE193 | 0.99971200 | 185.311 |
| 51 | 160.565830600 | 40.174196562 | SIO2HL | 1.56028895 | 132.555 |
| 52 | 202.910977254 | 1.342289784 | HE193 | 0.99971200 | 122.679 |
| 53 | 157.797608135 | 61.229633415 | SIO2HL | 1.56028895 | 114.327 |
| 54 | 535.601426702 | 12.273585235 | HE193 | 0.99971200 | 94.469 |
| 55 | 15736.124930284 | 15.585688667 | SIO2HL | 1.56028895 | 82.958 |
| 56 | 394.939976545 | 3.776081840 | HE193 | 0.99971200 | 66.876 |
| 57 | 316.842290121 | 22.015913317 | SIO2HL | 1.56028895 | 60.946 |
| 58 | 7602.251381444 | 2.700000000 | L710 | 0.99998200 | 48.241 |
| 59 | 0.000000000 | 3.150000000 | SIO2HL | 1.56028895 | 40.032 |
| 60 | 0.000000000 | 9.000000000 | L710 | 0.99998200 | 37.593 |
| 61 | 0.000000000 | 0.000000000 | | 1.00000000 | 14.020 |

TABLE 2

SURFACE NO. 2

| K | 0.0000 |
|---|---|
| C1 | 1.22433248e−008 |
| C2 | 9.17630275e−012 |
| C3 | 5.91043068e−016 |
| C4 | −2.47816893e−019 |
| C5 | 3.41011256e−023 |
| C6 | −2.42906864e−027 |

SURFACE NO. 4

| K | 0.0000 |
|---|---|
| C1 | 2.09935818e−007 |
| C2 | −1.58583859e−011 |
| C3 | −7.02615456e−016 |

TABLE 2-continued

| C4 | 3.85802113e−019 |
|---|---|
| C5 | −7.10886225e−023 |
| C6 | 7.34912873e−027 |
| C7 | −3.35590933e−031 |

SURFACE NO. 7

| K | 0.0000 |
|---|---|
| C1 | 6.30425513e−009 |
| C2 | −3.91904384e−013 |
| C3 | −1.31611782e−017 |
| C4 | −2.73217947e−021 |
| C5 | −3.04177451e−025 |
| C6 | 6.68937241e−029 |
| C7 | −3.22999413e−033 |

TABLE 2-continued

SURFACE NO. 10

| | |
|---|---|
| K | 0.0000 |
| C1 | 4.51583031e−009 |
| C2 | 1.37702459e−013 |
| C3 | −6.06055882e−018 |
| C4 | −2.53779695e−022 |
| C5 | −3.73570196e−027 |
| C6 | 1.13076924e−030 |
| C7 | −3.82690442e−035 |

SURFACE NO. 23

| | |
|---|---|
| K | 0.0000 |
| C1 | 7.72459905e−008 |
| C2 | 3.04280743e−012 |
| C3 | 2.31066672e−016 |
| C4 | 4.78460943e−021 |
| C5 | 4.57773509e−024 |
| C6 | −5.03222417e−028 |
| C7 | 5.93537498e−032 |

SURFACE NO. 31

| | |
|---|---|
| K | 0.0000 |
| C1 | 1.22715232e−008 |
| C2 | −5.90002335e−013 |
| C3 | −1.03677463e−017 |
| C4 | 1.00008208e−022 |
| C5 | 1.75475591e−026 |
| C6 | −6.61198967e−031 |

SURFACE NO. 36

| | |
|---|---|
| K | 0.0000 |
| C1 | 3.01531517e−009 |
| C2 | −4.91017017e−014 |
| C3 | 2.75994489e−019 |
| C4 | 2.00585563e−023 |
| C5 | −1.33495290e−027 |
| C6 | 7.55261132e−032 |
| C7 | −3.14630848e−037 |

SURFACE NO. 41

| | |
|---|---|
| K | 0.0000 |
| C1 | −3.34727519e−010 |
| C2 | −1.54638784e−014 |
| C3 | −2.56886946e−019 |
| C4 | 2.42822109e−025 |
| C5 | 1.92288995e−029 |
| C6 | 7.09209045e−033 |

TABLE 2-continued

SURFACE NO. 43

| | |
|---|---|
| K | 0.0000 |
| C1 | −6.26438092e−010 |
| C2 | −2.42562722e−015 |
| C3 | −1.54495891e−019 |
| C4 | −1.83563042e−024 |
| C5 | 4.03910963e−029 |
| C6 | 2.69828997e−033 |
| C7 | −1.10606501e−037 |

SURFACE NO. 45

| | |
|---|---|
| K | 0.0000 |
| C1 | −3.73975169e−009 |
| C2 | −3.74336974e−015 |
| C3 | 9.45872960e−019 |
| C4 | −1.44091264e−024 |
| C5 | 1.88129553e−028 |
| C6 | 2.31885357e−033 |
| C7 | −7.26295145e−038 |

SURFACE NO. 48

| | |
|---|---|
| K | 0.0000 |
| C1 | −4.13086555e−010 |
| C2 | 3.90501705e−014 |
| C3 | 3.91619841e−020 |
| C4 | 3.21475780e−024 |
| C5 | 1.41056342e−028 |
| C6 | 7.14264851e−034 |
| C7 | 1.33303621e−038 |

SURFACE NO. 50

| | |
|---|---|
| K | 0.0000 |
| C1 | 8.02621332e−010 |
| C2 | 1.98373377e−014 |
| C3 | 1.35524355e−022 |
| C4 | −1.48469224e−024 |
| C5 | −1.00499822e−030 |
| C6 | −1.45678875e−033 |
| C7 | 5.08658073e−038 |

TABLE 3

(Shs2004)

| SURFACE | RADII | THICKNESSES | GLASSES | REFRACTIVE INDEX 157.629 nm | ½ FREE DIAMETER |
|---|---|---|---|---|---|
| 0 | 0.000000000 | 25.017498240 | N2V157 | 1.00031429 | 41.617 |
| 1 | 0.000000000 | 1.905032434 | N2V157 | 1.00031429 | 47.527 |
| 2 | 19166.139614900AS | 5.960085409 | CAF2V157 | 1.55929035 | 48.157 |
| 3 | 119.172116093 | 3.094631417 | N2V157 | 1.00031429 | 50.106 |
| 4 | 160.220213679AS | 6.254374560 | CAF2V157 | 1.55929035 | 51.869 |
| 5 | 162.519152248 | 27.782451972 | N2V157 | 1.00031429 | 52.305 |
| 6 | −94.077615349 | 6.711100917 | CAF2V157 | 1.55929035 | 53.364 |
| 7 | 434.801298224AS | 4.386889894 | N2V157 | 1.00031429 | 67.969 |
| 8 | 645.264518232 | 33.749703361 | CAF2V157 | 1.55929035 | 72.538 |
| 9 | −148.333939508 | 0.521197880 | N2V157 | 1.00031429 | 76.917 |
| 10 | 709.275977518AS | 29.000976049 | CAF2V157 | 1.55929035 | 91.242 |
| 11 | −317.503191065 | 0.562186502 | N2V157 | 1.00031429 | 93.166 |
| 12 | 259.994970434 | 20.919102516 | CAF2V157 | 1.55929035 | 99.645 |
| 13 | 776.574450968 | 0.791803254 | N2V157 | 1.00031429 | 99.389 |
| 14 | 215.152145251 | 73.117973823 | CAF2V157 | 1.55929035 | 99.739 |
| 15 | 20868.347899500 | 0.521197880 | N2V157 | 1.00031429 | 91.408 |
| 16 | 202.493483250 | 23.070977801 | CAF2V157 | 1.55929035 | 86.145 |
| 17 | 558.418132627 | 0.521197880 | N2V157 | 1.00031429 | 82.759 |
| 18 | 186.405556634 | 13.439476629 | CAF2V157 | 1.55929035 | 77.613 |
| 19 | 267.922416674 | 0.521197880 | N2V157 | 1.00031429 | 74.394 |

TABLE 3-continued (Shs2004)

| SURFACE | RADII | THICKNESSES | GLASSES | REFRACTIVE INDEX 157.629 nm | ½ FREE DIAMETER |
|---|---|---|---|---|---|
| 20 | 200.469246207 | 33.723938177 | CAF2V157 | 1.55929035 | 72.415 |
| 21 | 125.811608898 | 9.365001399 | N2V157 | 1.00031429 | 55.894 |
| 22 | 248.201572583 | 5.956547200 | CAF2V157 | 1.55929035 | 54.715 |
| 23 | 223.381908745AS | 25.172315656 | N2V157 | 1.00031429 | 51.710 |
| 24 | −94.453554360 | 6.254374560 | CAF2V157 | 1.55929035 | 50.681 |
| 25 | 485.764221114 | 17.150487522 | N2V157 | 1.00031429 | 51.201 |
| 26 | −117.021217251 | 16.344741038 | CAF2V157 | 1.55929035 | 51.440 |
| 27 | 453.448396924 | 18.745918625 | N2V157 | 1.00031429 | 58.835 |
| 28 | −192.539933332 | 12.040746634 | CAF2V157 | 1.55929035 | 61.189 |
| 29 | −10110.942296700 | 7.631352005 | N2V157 | 1.00031429 | 70.434 |
| 30 | −598.476704330 | 24.995144443 | CAF2V157 | 1.55929035 | 73.019 |
| 31 | −277.690546428AS | 2.270348155 | N2V157 | 1.00031429 | 81.569 |
| 32 | −357.341411711 | 31.502092471 | CAF2V157 | 1.55929035 | 83.988 |
| 33 | −124.901240251 | 18.757658255 | N2V157 | 1.00031429 | 86.879 |
| 34 | 262.323405524 | 9.339597466 | CAF2V157 | 1.55929035 | 103.686 |
| 35 | 178.666624180 | 28.718074096 | N2V157 | 1.00031429 | 103.248 |
| 36 | 686.201269935AS | 9.311366752 | CAF2V157 | 1.55929035 | 105.517 |
| 37 | 309.588340572 | 9.899187354 | N2V157 | 1.00031429 | 109.811 |
| 38 | 334.272397140 | 35.656478162 | CAF2V157 | 1.55929035 | 119.166 |
| 39 | −969.269108454 | 0.543015101 | N2V157 | 1.00031429 | 120.560 |
| 40 | 408.715545997 | 57.937117409 | CAF2V157 | 1.55929035 | 131.252 |
| 41 | −306.960999184AS | 22.291849608 | N2V157 | 1.00031429 | 131.758 |
| 42 | −196.797761340 | 11.726952300 | CAF2V157 | 1.55929035 | 131.415 |
| 43 | −394.026784416AS | 27.549030800 | N2V157 | 1.00031429 | 139.222 |
| 44 | 0.000000000 | −7.445684000 | N2V157 | 1.00031429 | 137.237 |
| 45 | 324.234131088AS | 11.726952300 | CAF2V157 | 1.55929035 | 148.288 |
| 46 | 208.898767751 | 12.784071759 | N2V157 | 1.00031429 | 144.316 |
| 47 | 239.964906784 | 70.883531850 | CAF2V157 | 1.55929035 | 147.077 |
| 48 | −736.057578242AS | 0.747525039 | N2V157 | 1.00031429 | 146.792 |
| 49 | 249.829910804 | 61.833878347 | CAF2V157 | 1.55929035 | 140.681 |
| 50 | −825.134407817AS | 1.050234898 | N2V157 | 1.00031429 | 138.269 |
| 51 | 119.514360013 | 29.939342632 | CAF2V157 | 1.55929035 | 98.761 |
| 52 | 151.480856759 | 1.047402614 | N2V157 | 1.00031429 | 91.482 |
| 53 | 117.647396280 | 45.612524461 | CAF2V157 | 1.55929035 | 85.201 |
| 54 | 398.984860293 | 9.163549260 | N2V157 | 1.00031429 | 70.387 |
| 55 | 10414.727506900 | 11.628662517 | CAF2V157 | 1.55929035 | 61.739 |
| 56 | 294.280794199 | 2.821757461 | N2V157 | 1.00031429 | 49.745 |
| 57 | 237.014551128 | 16.417043400 | CAF2V157 | 1.55929035 | 45.331 |
| 58 | 5516.098537170 | 2.010334680 | N2V157 | 1.00031429 | 35.814 |
| 59 | 0.000000000 | 2.345390460 | CAF2V157 | 1.55929035 | 30.321 |
| 60 | 0.000000000 | 6.701115600 | N2V157 | 1.00031429 | 28.554 |
| 61 | 0.000000000 | | | | 10.404 |

TABLE 4

| SURFACE NO. 2 | |
|---|---|
| K | 0.0000 |
| C1 | 4.04200750e−008 |
| C2 | 3.81876586e−011 |
| C3 | 5.03315092e−015 |
| C4 | −3.49627521e−018 |
| C5 | 8.55465831e−022 |
| C6 | −1.10162987e−025 |
| SURFACE NO. 4 | |
| K | 0.0000 |
| C1 | 5.00885457e−007 |
| C2 | −6.73594057e−011 |
| C3 | −5.63021479e−015 |
| C4 | 5.25874660e−018 |
| C5 | −1.72712950e−021 |
| C6 | 3.18784558e−025 |
| C7 | −2.59898831e−029 |
| SURFACE NO. 7 | |
| K | 0.0000 |
| C1 | 1.63223882e−008 |
| C2 | −1.63813024e−012 |
| C3 | −1.08828380e−016 |

TABLE 4-continued

| C4 | −5.14236275e−020 |
|---|---|
| C5 | −4.70980651e−024 |
| C6 | 2.65671689e−027 |
| C7 | −2.41428161e−031 |
| SURFACE NO. 10 | |
| K | 0.0000 |
| C1 | 1.08458836e−008 |
| C2 | 6.34606387e−013 |
| C3 | −4.79999941e−017 |
| C4 | −3.88550006e−021 |
| C5 | −7.97813456e−026 |
| C6 | 5.17810873e−029 |
| C7 | −3.15751405e−033 |
| SURFACE NO. 23 | |
| K | 0.0000 |
| C1 | 1.86228378e−007 |
| C2 | 1.34530827e−011 |
| C3 | 1.90817638e−015 |
| C4 | 2.47700195e−020 |
| C5 | 1.48998352e−022 |
| C6 | −3.26357684e−026 |
| C7 | 6.39194153e−030 |

TABLE 4-continued

SURFACE NO. 31

| | |
|---|---|
| K | 0.0000 |
| C1 | 3.00166168e−008 |
| C2 | −2.58415596e−012 |
| C3 | −8.33331517e−017 |
| C4 | 1.36287634e−021 |
| C5 | 4.56615511e−025 |
| C6 | −3.21288704e−029 |

SURFACE NO. 36

| | |
|---|---|
| K | 0.0000 |
| C1 | 7.42096101e−009 |
| C2 | −2.14890363e−013 |
| C3 | 2.10259884e−018 |
| C4 | 2.93924925e−022 |
| C5 | −3.44512052e−026 |
| C6 | 3.42432345e−030 |
| C7 | −2.42014198e−035 |

SURFACE NO. 41

| | |
|---|---|
| K | 0.0000 |
| C1 | −8.35434016e−010 |
| C2 | −6.91469747e−014 |
| C3 | −2.02033656e−018 |
| C4 | 2.25402896e−024 |
| C5 | 3.72242911e−028 |
| C6 | 3.20803731e−031 |

SURFACE NO. 43

| | |
|---|---|
| K | 0.0000 |
| C1 | −1.52986987e−009 |
| C2 | −1.10887104e−014 |
| C3 | −1.19044876e−018 |
| C4 | −2.65113635e−023 |
| C5 | 1.01435593e−027 |
| C6 | 1.25351252e−031 |
| C7 | −9.10473118e−036 |

SURFACE NO. 45

| | |
|---|---|
| K | 0.0000 |
| C1 | −9.04760702e−009 |
| C2 | −1.63991553e−014 |
| C3 | 7.44005317e−018 |
| C4 | −2.09009335e−023 |
| C5 | 4.81547907e−027 |
| C6 | 1.07329470e−031 |
| C7 | −6.06561304e−036 |

SURFACE NO. 48

| | |
|---|---|
| K | 0.0000 |
| C1 | −1.01554668e−009 |
| C2 | 1.70305715e−013 |
| C3 | 2.95803828e−019 |
| C4 | 4.48800481e−023 |
| C5 | 3.60194072e−027 |
| C6 | 3.09218205e−032 |
| C7 | 1.11798441e−036 |

SURFACE NO. 50

| | |
|---|---|
| K | 0.0000 |
| C1 | 1.93111104e−009 |
| C2 | 8.65128317e−014 |
| C3 | 6.58669900e−021 |
| C4 | −2.03332737e−023 |
| C5 | −2.20168557e−029 |
| C6 | −6.84618723e−032 |
| C7 | 4.14434278e−036 |

TABLE 5

(m1659a)

| SURFACE | RADII | THICKNESSES | GLASSES | REFRACTIVE INDEX 193.304 nm | ½ FREE DIAMETER |
|---|---|---|---|---|---|
| 0 | 0.000000000 | 32.000000000 | L710 | 0.99998200 | 56.080 |
| 1 | 0.000000000 | 3.100000000 | L710 | 0.99998200 | 63.460 |
| 2 | 0.000000000 | 8.000000000 | SIO2HL | 1.56028900 | 64.175 |
| 3 | 214.374691678 | 6.768422494 | HE193 | 0.99971200 | 66.898 |
| 4 | 678.966348965AS | 8.000000000 | SIO2HL | 1.56028900 | 68.402 |
| 5 | 295.639011035 | 37.169733715 | HE193 | 0.99971200 | 69.900 |
| 6 | −111.652887331 | 16.192909187 | SIO2HL | 1.56028900 | 71.248 |
| 7 | 1435.846896630AS | 2.614024194 | HE193 | 0.99971200 | 97.000 |
| 8 | 1427.381076990 | 41.812512207 | SIO2HL | 1.56028900 | 100.696 |
| 9 | −207.640254189 | 0.700000000 | HE193 | 0.99971200 | 106.045 |
| 10 | 584.088602595AS | 42.576490437 | SIO2HL | 1.56028900 | 132.378 |
| 11 | −481.678249044 | 0.700000000 | HE193 | 0.99971200 | 134.179 |
| 12 | 406.807321876 | 35.706452882 | SIO2HL | 1.56028900 | 142.827 |
| 13 | −5625.700893160 | 0.700000000 | HE193 | 0.99971200 | 142.670 |
| 14 | 298.176737082 | 79.446714434 | SIO2HL | 1.56028900 | 140.967 |
| 15 | −13921.627398000 | 3.719595268 | HE193 | 0.99971200 | 131.651 |
| 16 | 448.349842071 | 28.279136919 | SIO2HL | 1.56028900 | 123.944 |
| 17 | 1417.631668090 | 0.792030769 | HE193 | 0.99971200 | 118.744 |
| 18 | 223.937979671 | 14.944850216 | SIO2HL | 1.56028900 | 107.384 |
| 19 | 146.318064199 | 3.170742365 | HE193 | 0.99971200 | 95.625 |
| 20 | 122.769528398 | 41.476354079 | SIO2HL | 1.56028900 | 92.370 |
| 21 | 392.244315955 | 7.795170437 | HE193 | 0.99971200 | 86.941 |
| 22 | 704.124769671 | 12.864149054 | SIO2HL | 1.56028900 | 84.284 |
| 23 | 206.226483591AS | 41.697630229 | HE193 | 0.99971200 | 71.571 |
| 24 | −136.542261472 | 8.000000000 | SIO2HL | 1.56028900 | 68.125 |
| 25 | 188.276100920 | 34.851670699 | HE193 | 0.99971200 | 66.714 |
| 26 | −266.296401208 | 11.337537040 | SIO2HL | 1.56028900 | 68.908 |
| 27 | 828.502027259 | 27.472554480 | HE193 | 0.99971200 | 73.632 |

TABLE 5-continued (m1659a)

| SURFACE | RADII | THICKNESSES | GLASSES | REFRACTIVE INDEX 193.304 nm | ½ FREE DIAMETER |
|---|---|---|---|---|---|
| 28 | −188.039957784 | 10.048803630 | SIO2HL | 1.56028900 | 76.651 |
| 29 | −286.338776941 | 11.364281707 | HE193 | 0.99971200 | 82.442 |
| 30 | −195.263210167 | 27.977992639 | SIO2HL | 1.56028900 | 84.451 |
| 31 | −210.425554231AS | 2.668847644 | HE193 | 0.99971200 | 95.869 |
| 32 | −359.454820504 | 33.263873624 | SIO2HL | 1.56028900 | 100.866 |
| 33 | −179.268898245 | 19.520108899 | HE193 | 0.99971200 | 105.926 |
| 34 | 301.090725759 | 12.000000000 | SIO2HL | 1.56028900 | 123.535 |
| 35 | 210.449149431 | 31.394452961 | HE193 | 0.99971200 | 122.750 |
| 36 | 708.827802225AS | 12.000000000 | SIO2HL | 1.56028900 | 124.201 |
| 37 | 368.041113973 | 9.972701330 | HE193 | 0.99971200 | 128.960 |
| 38 | 399.107567619 | 44.538775677 | SIO2HL | 1.56028900 | 136.284 |
| 39 | −764.045549260 | 0.700000000 | HE193 | 0.99971200 | 137.910 |
| 40 | 551.145029040 | 48.906287759 | SIO2HL | 1.56028900 | 145.979 |
| 41 | −510.329983328AS | 33.432166582 | HE193 | 0.99971200 | 146.810 |
| 42 | −234.804925584 | 15.000000000 | SIO2HL | 1.56028900 | 146.808 |
| 43 | −435.743783861 | 24.039044390 | HE193 | 0.99971200 | 156.860 |
| 44 | 0.000000000 | 1.800000000 | HE193 | 0.99971200 | 158.282 |
| 45 | 548.700219435AS | 15.000000000 | SIO2HL | 1.56028900 | 173.490 |
| 46 | 301.445277190 | 13.491008474 | HE193 | 0.99971200 | 174.191 |
| 47 | 366.662373729 | 87.073931844 | SIO2HL | 1.56028900 | 176.150 |
| 48 | −550.992057843AS | 0.700000000 | HE193 | 0.99971200 | 177.412 |
| 49 | 470.272792479 | 71.690763514 | SIO2HL | 1.56028900 | 176.239 |
| 50 | −524.235839398AS | 0.700000000 | HE193 | 0.99971200 | 175.005 |
| 51 | 143.906521816 | 40.003798335 | SIO2HL | 1.56028900 | 123.753 |
| 52 | 189.600309947 | 1.071971036 | HE193 | 0.99971200 | 116.154 |
| 53 | 144.836316227 | 31.828068261 | SIO2HL | 1.56028900 | 108.008 |
| 54 | 218.443210665 | 0.700000000 | HE193 | 0.99971200 | 100.536 |
| 55 | 190.712173887 | 25.768276703 | SIO2HL | 1.56028900 | 97.024 |
| 56 | 370.701088466 | 9.564358749 | HE193 | 0.99971200 | 87.535 |
| 57 | 807.447019199 | 15.749130690 | SIO2HL | 1.56028900 | 80.461 |
| 58 | 171.924005396 | 7.148775604 | HE193 | 0.99971200 | 61.353 |
| 59 | 181.279659482 | 24.378394256 | CAF2HL | 1.50143600 | 55.679 |
| 60 | 1752.925125720 | 3.615508978 | L710 | 0.99998200 | 42.509 |
| 61 | 0.000000000 | 3.000000000 | SIO2HL | 1.56028900 | 34.651 |
| 62 | 0.000000000 | 8.000000000 | L710 | 0.99998200 | 32.423 |
| 63 | 0.000000000 | | | | 14.020 |

TABLE 6

| SURFACE NO. 4 | |
|---|---|
| K | 0.0000 |
| C1 | 1.89471885e−007 |
| C2 | −6.02710229e−012 |
| C3 | 1.53417903e−016 |
| C4 | −2.42817642e−020 |
| C5 | 5.70562716e−024 |
| C6 | −7.46671442e−028 |
| C7 | 4.25930704e−032 |

| SURFACE NO. 7 | |
|---|---|
| K | 0.0000 |
| C1 | 3.66131696e−009 |
| C2 | −1.30949841e−013 |
| C3 | 1.06295513e−016 |
| C4 | −9.94272982e−021 |
| C5 | 3.83041775e−025 |
| C6 | 2.71682194e−030 |
| C7 | −5.66222517e−034 |

| SURFACE NO. 10 | |
|---|---|
| K | 0.0000 |
| C1 | −5.39079178e−010 |
| C2 | 1.65472968e−013 |
| C3 | −1.48200988e−018 |
| C4 | −4.26542196e−022 |
| C5 | 2.23375010e−026 |
| C6 | −4.68780777e−031 |
| C7 | 2.49086051e−036 |

TABLE 6-continued

| SURFACE NO. 23 | |
|---|---|
| K | 0.0000 |
| C1 | 1.12693938e−007 |
| C2 | 3.12498460e−012 |
| C3 | 1.69981511e−016 |
| C4 | 3.48067953e−020 |
| C5 | −5.03222312e−024 |
| C6 | 8.68868128e−028 |
| C7 | −3.88286424e−032 |

| SURFACE NO. 31 | |
|---|---|
| K | 0.0000 |
| C1 | 7.59066257e−009 |
| C2 | −5.13712565e−013 |
| C3 | −1.12360493e−017 |
| C4 | −1.78576425e−021 |
| C5 | 9.58992339e−026 |
| C6 | −6.73381570e−030 |

| SURFACE NO. 36 | |
|---|---|
| K | 0.0000 |
| C1 | 1.25923077e−009 |
| C2 | −2.53075485e−014 |
| C3 | 3.04931813e−018 |
| C4 | −1.11476591e−022 |
| C5 | −2.12954081e−027 |
| C6 | 3.80719952e−031 |
| C7 | −1.32616533e−035 |

TABLE 6-continued

SURFACE NO. 41

| | |
|---|---|
| K | 0.0000 |
| C1 | 8.47964979e-010 |
| C2 | 1.31624211e-014 |
| C3 | -6.67941632e-019 |
| C4 | -2.85032922e-023 |
| C5 | 9.45648624e-028 |
| C6 | 3.12077825e-033 |

SURFACE NO. 45

| | |
|---|---|
| K | 0.0000 |
| C1 | -3.98398365e-009 |
| C2 | -8.63014001e-015 |
| C3 | 1.08554002e-018 |
| C4 | 3.83549756e-025 |
| C5 | 4.90933881e-028 |
| C6 | 5.51369375e-033 |
| C7 | -2.09514835e-037 |

SURFACE NO. 48

| | |
|---|---|
| K | 0.0000 |
| C1 | -2.57047835e-011 |
| C2 | 2.34238635e-014 |
| C3 | 2.59035963e-019 |
| C4 | 2.27193081e-024 |
| C5 | 5.82554954e-029 |
| C6 | 4.60561363e-033 |
| C7 | -4.21140368e-038 |

SURFACE NO. 50

| | |
|---|---|
| K | 0.0000 |
| C1 | 4.01128359e-010 |
| C2 | 2.65597086e-015 |
| C3 | 6.44693849e-020 |
| C4 | 4.81837039e-024 |
| C5 | 1.01089127e-028 |
| C6 | -5.98482220e-033 |
| C7 | 1.07932955e-037 |

TABLE 7

(Shs2010)

| SURFACE | RADII | THICKNESSES | GLASSES | REFRACTIVE INDEX 157.629 nm | ½ FREE DIAMETER |
|---|---|---|---|---|---|
| 0 | 0.000000000 | 27.200000000 | N2V157 | 1.00031429 | 45.607 |
| 1 | 0.000000000 | 1.078880752 | N2V157 | 1.00031429 | 52.255 |
| 2 | 1045.314373860AS | 7.513476207 | CAF2V157 | 1.55929035 | 53.175 |
| 3 | 114.248430605 | 5.626540893 | N2V157 | 1.00031429 | 54.906 |
| 4 | 186.055500442AS | 9.260588934 | CAF2V157 | 1.55929035 | 57.362 |
| 5 | 182.393999171 | 22.566534529 | N2V157 | 1.00031429 | 58.070 |
| 6 | -183.513133835 | 7.502341067 | CAF2V157 | 1.55929035 | 59.394 |
| 7 | 283.035779024AS | 6.154441203 | N2V157 | 1.00031429 | 69.752 |
| 8 | 401.580615857 | 36.640413384 | CAF2V157 | 1.55929035 | 74.376 |
| 9 | -281.777697307 | 0.861477292 | N2V157 | 1.00031429 | 82.029 |
| 10 | 353.134032777AS | 21.777939897 | CAF2V157 | 1.55929035 | 96.624 |
| 11 | 6025.441766310 | 0.939333289 | N2V157 | 1.00031429 | 97.803 |
| 12 | 215.727113313 | 16.642509432 | CAF2V157 | 1.55929035 | 104.912 |
| 13 | 311.039356614 | 1.720069535 | N2V157 | 1.00031429 | 104.543 |
| 14 | 228.409410676 | 53.091993802 | CAF2V157 | 1.55929035 | 105.751 |
| 15 | -758.217583901 | 0.700000000 | N2V157 | 1.00031429 | 103.603 |
| 16 | 132.798453265 | 34.216733306 | CAF2V157 | 1.55929035 | 92.164 |
| 17 | 325.068121782 | 0.700376490 | N2V157 | 1.00031429 | 87.829 |
| 18 | 274.542764700 | 14.522646582 | CAF2V157 | 1.55929035 | 86.310 |
| 19 | 338.880545591 | 0.701615532 | N2V157 | 1.00031429 | 81.119 |
| 20 | 290.554636535 | 35.428116482 | CAF2V157 | 1.55929035 | 79.777 |
| 21 | 3517.019128770 | 8.536647573 | N2V157 | 1.00031429 | 66.983 |
| 22 | -432.647390565 | 7.503695666 | CAF2V157 | 1.55929035 | 63.895 |
| 23 | 351.066950680AS | 27.713652572 | N2V157 | 1.00031429 | 55.675 |
| 24 | -96.698497704 | 6.786155040 | CAF2V157 | 1.55929035 | 54.460 |
| 25 | 409.131134381 | 22.127454363 | N2V157 | 1.00031429 | 55.555 |
| 26 | -112.905403831 | 7.514387520 | CAF2V157 | 1.55929035 | 56.043 |
| 27 | 648.671802143 | 18.457185848 | N2V157 | 1.00031429 | 63.374 |
| 28 | -184.515622336 | 13.993219919 | CAF2V157 | 1.55929035 | 65.303 |
| 29 | 1230.992852820 | 11.356478659 | N2V157 | 1.00031429 | 79.407 |
| 30 | -2362.593927680 | 29.065160418 | CAF2V157 | 1.55929035 | 87.263 |
| 31 | -316.217892752AS | 1.235135355 | N2V157 | 1.00031429 | 96.738 |
| 32 | -382.379645390 | 44.746901069 | CAF2V157 | 1.55929035 | 98.349 |
| 33 | -129.769453881 | 0.793115744 | N2V157 | 1.00031429 | 102.434 |
| 34 | 340.264743344 | 12.064670296 | CAF2V157 | 1.55929035 | 119.942 |
| 35 | 229.694535355 | 31.128991673 | N2V157 | 1.00031429 | 120.145 |
| 36 | 1287.330025580AS | 9.736539177 | CAF2V157 | 1.55929035 | 121.539 |
| 37 | 364.756756968 | 9.358478921 | N2V157 | 1.00031429 | 127.928 |

TABLE 7-continued (Shs2010)

| SURFACE | RADII | THICKNESSES | GLASSES | REFRACTIVE INDEX 157.629 nm | ½ FREE DIAMETER |
|---|---|---|---|---|---|
| 38 | 397.094346162 | 41.827853290 | CAF2V157 | 1.55929035 | 136.576 |
| 39 | −976.995908198 | 0.786915821 | N2V157 | 1.00031429 | 138.444 |
| 40 | 410.514102518 | 80.508348674 | CAF2V157 | 1.55929035 | 150.286 |
| 41 | −324.940917692AS | 28.497218849 | N2V157 | 1.00031429 | 150.806 |
| 42 | −210.576089850 | 12.724040700 | CAF2V157 | 1.55929035 | 149.372 |
| 43 | −405.186570491AS | 54.127665200 | N2V157 | 1.00031429 | 157.522 |
| 44 | 0.000000000 | −32.315024000 | N2V157 | 1.00031429 | 161.249 |
| 45 | 367.399928082AS | 12.724040700 | CAF2V157 | 1.55929035 | 163.212 |
| 46 | 234.556148176 | 15.776145720 | N2V157 | 1.00031429 | 158.116 |
| 47 | 262.828171603 | 81.195503690 | CAF2V157 | 1.55929035 | 162.673 |
| 48 | −725.847919437AS | 0.700158254 | N2V157 | 1.00031429 | 162.170 |
| 49 | 246.701752532 | 66.006758182 | CAF2V157 | 1.55929035 | 152.284 |
| 50 | −2127.666955970AS | 0.700000000 | N2V157 | 1.00031429 | 148.983 |
| 51 | 139.223624657 | 30.839009177 | CAF2V157 | 1.55929035 | 110.611 |
| 52 | 186.041725727 | 0.700000000 | N2V157 | 1.00031429 | 103.950 |
| 53 | 144.468793673 | 48.246174525 | CAF2V157 | 1.55929035 | 97.488 |
| 54 | 576.304531006AS | 11.297930555 | N2V157 | 1.00031429 | 82.155 |
| 55 | −1203.254778000 | 12.806934866 | CAF2V157 | 1.55929035 | 73.193 |
| 56 | 670.188680719 | 2.550471395 | N2V157 | 1.00031429 | 60.877 |
| 57 | 358.370758649 | 16.126420420 | CAF2V157 | 1.55929035 | 55.058 |
| 58 | −2011.367216580 | 2.181264120 | N2V157 | 1.00031429 | 46.664 |
| 59 | 0.000000000 | 7.500000000 | CAF2V157 | 1.55929035 | 38.403 |
| 60 | 0.000000000 | 7.000000000 | N2V157 | 1.00031429 | 32.640 |
| 61 | 0.000000000 | | | | 11.402 |

TABLE 8

| | SURFACE NO. 2 |
|---|---|
| K | 0.0000 |
| C1 | 1.43214516e−007 |
| C2 | −1.05523323e−011 |
| C3 | 1.33937296e−014 |
| C4 | −3.81541827e−018 |
| C5 | 7.71238693e−022 |
| C6 | −1.24442959e−025 |
| C7 | 1.04382716e−029 |
| | SURFACE NO. 4 |
| K | 0.0000 |
| C1 | 4.22469071e−007 |
| C2 | −2.02044975e−011 |
| C3 | −9.99096667e−015 |
| C4 | 2.57319928e−018 |
| C5 | −3.55404240e−022 |
| C6 | 2.76031008e−026 |
| C7 | −1.04425360e−030 |
| | SURFACE NO. 7 |
| K | 0.0000 |
| C1 | 6.69007068e−008 |
| C2 | −8.14794171e−012 |
| C3 | 1.44046983e−016 |
| C4 | −6.18733673e−020 |
| C5 | 1.33863248e−024 |
| C6 | 6.01771051e−028 |
| C7 | −4.18169671e−032 |
| | SURFACE NO. 10 |
| K | 0.0000 |
| C1 | 2.09103125e−008 |
| C2 | 3.74013441e−013 |
| C3 | −4.28287142e−017 |
| C4 | −7.74198571e−021 |
| C5 | 7.15651505e−025 |
| C6 | −2.00926873e−029 |
| C7 | −1.13570242e−034 |
| | SURFACE NO. 23 |
| K | 0.0000 |
| C1 | 2.79935405e−007 |

TABLE 8-continued

| C2 | 1.51575623e−011 |
|---|---|
| C3 | 1.48076409e−015 |
| C4 | 1.82749522e−019 |
| C5 | 4.42569184e−023 |
| C6 | −6.88248081e−027 |
| C7 | 2.98012936e−030 |
| | SURFACE NO. 31 |
| K | 0.0000 |
| C1 | 3.37616068e−008 |
| C2 | −1.35772165e−012 |
| C3 | −9.13855026e−017 |
| C4 | 2.55494973e−021 |
| C5 | 8.18743728e−026 |
| C6 | −3.21333945e−030 |
| C7 | −1.70882417e−034 |
| | SURFACE NO. 36 |
| K | 0.0000 |
| C1 | 3.39133645e−009 |
| C2 | −1.01165561e−013 |
| C3 | −4.16392158e−018 |
| C4 | −4.60775252e−023 |
| C5 | −4.18366165e−027 |
| C6 | −3.56809896e−032 |
| C7 | 6.85585311e−036 |
| | SURFACE NO. 41 |
| K | 0.0000 |
| C1 | −1.50447859e−009 |
| C2 | −4.05442091e−014 |
| C3 | −7.06684952e−019 |
| C4 | −2.92843853e−023 |
| C5 | 4.58323842e−028 |
| C6 | 2.24810472e−032 |
| C7 | 3.26320529e−037 |
| | SURFACE NO. 43 |
| K | 0.0000 |
| C1 | −1.43187993e−009 |
| C2 | 8.61397718e−015 |
| C3 | −4.27133053e−019 |
| C4 | −1.67623847e−023 |
| C5 | 7.56870039e−028 |

TABLE 8-continued

| | |
|---|---|
| C6 | 4.59600825e−032 |
| C7 | −1.56107786e−036 |
| SURFACE NO. 45 | |
| K | 0.0000 |
| C1 | −7.40459945e−009 |
| C2 | −9.68327166e−015 |
| C3 | 4.20547857e−018 |
| C4 | −2.29946961e−023 |
| C5 | 1.66748551e−027 |
| C6 | 4.76274324e−032 |
| C7 | −1.41676650e−036 |
| SURFACE NO. 48 | |
| K | 0.0000 |
| C1 | −1.11964446e−009 |
| C2 | 1.27445676e−013 |
| C3 | −6.74866729e−020 |
| C4 | 3.35598915e−023 |
| C5 | 1.67085809e−027 |
| C6 | −9.92306326e−033 |
| C7 | 4.04149705e−037 |

TABLE 8-continued

| | |
|---|---|
| SURFACE NO. 50 | |
| K | 0.0000 |
| C1 | 1.68697911e−009 |
| C2 | 6.71519010e−014 |
| C3 | −1.12711844e−018 |
| C4 | −3.58730491e−023 |
| C5 | 4.82205527e−028 |
| C6 | 2.73665299e−032 |
| C7 | −6.49697083e−037 |
| SURFACE NO. 54 | |
| K | 0.0000 |
| C1 | 8.11862732e−010 |
| C2 | 9.24410971e−014 |
| C3 | 4.20674572e−018 |
| C4 | 1.09384658e−021 |
| C5 | −1.19932277e−025 |
| C6 | 5.78613553e−030 |
| C7 | −3.28204739e−034 |

TABLE 9

(SHS2007)

| SURFACE | RADII | THICKNESSES | GLASSES | REFRACTIVE INDEX 193.304 nm | ½ FREE DIAMETER |
|---|---|---|---|---|---|
| 0 | 0.000000000 | 33.600000000 | L710 | 0.99998200 | 54.406 |
| 1 | 0.000000000 | 0.700000000 | L710 | 0.99998200 | 62.622 |
| 2 | 6082.059008953AS | 8.000000000 | SIO2HL | 1.56028895 | 63.203 |
| 3 | 143.971066538 | 5.220564877 | HE193 | 0.99971200 | 65.679 |
| 4 | 220.728491318AS | 14.894807261 | SIO2HL | 1.56028895 | 67.999 |
| 5 | 255.425625405 | 25.437504335 | HE193 | 0.99971200 | 69.274 |
| 6 | −213.790257832 | 8.000767193 | SIO2HL | 1.56028895 | 70.782 |
| 7 | 363.835685805AS | 7.715328993 | HE193 | 0.99971200 | 82.296 |
| 8 | 609.577684342 | 43.913943130 | SIO2HL | 1.56028895 | 86.335 |
| 9 | −315.746821165 | 0.872144807 | HE193 | 0.99971200 | 96.478 |
| 10 | 455.762005384AS | 27.106087902 | SIO2HL | 1.56028895 | 113.107 |
| 11 | 7229.021339243 | 0.704758668 | HE193 | 0.99971200 | 115.284 |
| 12 | 251.626671247 | 20.976022785 | SIO2HL | 1.56028895 | 124.960 |
| 13 | 363.067076891 | 3.470948804 | HE193 | 0.99971200 | 124.571 |
| 14 | 282.856636492 | 67.559653556 | SIO2HL | 1.56028895 | 126.222 |
| 15 | −901.244370913 | 2.358079827 | HE193 | 0.99971200 | 123.665 |
| 16 | 160.340001669 | 41.155799240 | SIO2HL | 1.56028895 | 111.328 |
| 17 | 490.332334286 | 1.787006860 | HE193 | 0.99971200 | 107.624 |
| 18 | 400.692503878 | 17.482624917 | SIO2HL | 1.56028895 | 105.263 |
| 19 | 1050.089846531 | 1.273289975 | HE193 | 0.99971200 | 101.323 |
| 20 | 682.408004442 | 43.747762196 | SIO2HL | 1.56028895 | 98.609 |
| 21 | 3103.102640660 | 10.767552226 | HE193 | 0.99971200 | 79.838 |
| 22 | −449.343998255 | 8.151994354 | SIO2HL | 1.56028895 | 76.964 |
| 23 | 481.606355829AS | 34.236197830 | HE193 | 0.99971200 | 67.953 |
| 24 | −121.665966102 | 8.400000000 | SIO2HL | 1.56028895 | 65.854 |
| 25 | 374.980814433 | 26.204024332 | HE193 | 0.99971200 | 67.217 |
| 26 | −143.249767685 | 8.035536657 | SIO2HL | 1.56028895 | 67.743 |
| 27 | 884.703729247 | 23.779221943 | HE193 | 0.99971200 | 76.105 |
| 28 | −243.498696219 | 18.114116074 | SIO2HL | 1.56028895 | 80.078 |
| 29 | 11014.244296721 | 14.108602625 | HE193 | 0.99971200 | 95.668 |
| 30 | −1710.670778965 | 36.476108265 | SIO2HL | 1.56028895 | 105.564 |
| 31 | −509.290793668AS | 3.799046038 | HE193 | 0.99971200 | 120.040 |
| 32 | −522.760271037 | 55.102056532 | SIO2HL | 1.56028895 | 121.425 |
| 33 | −162.101214724 | 0.700000000 | HE193 | 0.99971200 | 126.271 |
| 34 | 408.832035177 | 12.000000000 | SIO2HL | 1.56028895 | 148.654 |
| 35 | 285.314514094 | 38.599460894 | HE193 | 0.99971200 | 148.869 |
| 36 | 1647.197381837AS | 12.000000000 | SIO2HL | 1.56028895 | 150.501 |
| 37 | 452.111295331 | 11.431144357 | HE193 | 0.99971200 | 158.593 |
| 38 | 495.143365449 | 50.265656014 | SIO2HL | 1.56028895 | 169.187 |
| 39 | −1181.451218240 | 0.700000000 | HE193 | 0.99971200 | 171.160 |
| 40 | 504.444538837 | 108.309739630 | SIO2HL | 1.56028895 | 186.338 |
| 41 | −402.406909600AS | 35.218931962 | HE193 | 0.99971200 | 187.299 |

TABLE 9-continued

(SHS2007)

| SURFACE | RADII | THICKNESSES | GLASSES | REFRACTIVE INDEX 193.304 nm | ½ FREE DIAMETER |
|---|---|---|---|---|---|
| 42 | −260.687700983 | 15.750000000 | SIO2HL | 1.56028895 | 185.680 |
| 43 | −501.804439493AS | 67.000000000 | HE193 | 0.99971200 | 196.016 |
| 44 | 0.000000000 | −40.000000000 | HE193 | 0.99971200 | 200.793 |
| 45 | 439.023921910AS | 15.750000000 | SIO2HL | 1.56028895 | 203.535 |
| 46 | 286.281672961 | 18.419961595 | HE193 | 0.99971200 | 196.728 |
| 47 | 320.640783540 | 98.196888764 | SIO2HL | 1.56028895 | 201.435 |
| 48 | −938.097514827AS | 0.700000000 | HE193 | 0.99971200 | 200.897 |
| 49 | 302.624264758 | 84.618876500 | SIO2HL | 1.56028895 | 188.254 |
| 50 | −3200.587702255AS | 0.730670643 | HE193 | 0.99971200 | 182.786 |
| 51 | 170.842340056 | 38.317749380 | SIO2HL | 1.56028895 | 136.139 |
| 52 | 222.792535873 | 1.144357720 | HE193 | 0.99971200 | 127.200 |
| 53 | 170.961511698 | 59.825366410 | SIO2HL | 1.56028895 | 118.623 |
| 54 | 671.886005497AS | 14.144748840 | HE193 | 0.99971200 | 100.059 |
| 55 | −1782.275044587 | 16.050043219 | SIO2HL | 1.56028895 | 86.783 |
| 56 | 683.979935539 | 3.683343415 | HE193 | 0.99971200 | 71.293 |
| 57 | 415.132395267 | 20.066273975 | SIO2HL | 1.56028895 | 64.045 |
| 58 | −3089.397426921 | 2.700000000 | L710 | 0.99998200 | 53.104 |
| 59 | 0.000000000 | 3.150000000 | SIO2HL | 1.56028895 | 43.475 |
| 60 | 0.000000000 | 9.000000000 | L710 | 0.99998200 | 41.056 |
| 61 | 0.000000000 | | | | 13.602 |

TABLE 10

| | SURFACE NO. 2 | |
|---|---|---|
| K | | 0.0000 |
| C1 | | 6.13378195e−008 |
| C2 | | −1.21093962e−012 |
| C3 | | 4.03974995e−015 |
| C4 | | −9.55444255e−019 |
| C5 | | 1.47785598e−022 |
| C6 | | −1.63598785e−026 |
| C7 | | 8.81916303e−031 |
| | SURFACE NO. 4 | |
| K | | 0.0000 |
| C1 | | 2.40106346e−007 |
| C2 | | −1.01253531e−011 |
| C3 | | −3.29559355e−015 |
| C4 | | 7.33617239e−019 |
| C5 | | −8.72083684e−023 |
| C6 | | 6.00312066e−027 |
| C7 | | −1.80286882e−031 |
| | SURFACE NO. 7 | |
| K | | 0.0000 |
| C1 | | 4.18009370e−008 |
| C2 | | −2.90287476e−012 |
| C3 | | −6.63126937e−017 |
| C4 | | −1.02006062e−020 |
| C5 | | 1.19401776e−024 |
| C6 | | −3.86272749e−029 |
| C7 | | 1.07942556e−033 |
| | SURFACE NO. 10 | |
| K | | 0.0000 |
| C1 | | 1.02570958e−008 |
| C2 | | 1.91710967e−013 |
| C3 | | −2.01472753e−017 |
| C4 | | −9.85838048e−022 |
| C5 | | 8.93935503e−026 |
| C6 | | −2.25592871e−030 |
| C7 | | 6.58672348e−036 |
| | SURFACE NO. 23 | |
| K | | 0.0000 |
| C1 | | 1.54526224e−007 |
| C2 | | 5.83194952e−012 |
| C3 | | 3.45258425e−016 |
| C4 | | 3.91617672e−020 |

TABLE 10-continued

| | | |
|---|---|---|
| C5 | | 4.12332466e−025 |
| C6 | | 3.60449958e−028 |
| C7 | | 5.30220523e−032 |
| | SURFACE NO. 31 | |
| K | | 0.0000 |
| C1 | | 1.96722680e−008 |
| C2 | | −5.31456030e−013 |
| C3 | | −2.13215304e−017 |
| C4 | | 7.69697830e−022 |
| C5 | | 2.76794296e−027 |
| C6 | | −3.72884626e−031 |
| C7 | | 5.44983867e−037 |
| | SURFACE NO. 36 | |
| K | | 0.0000 |
| C1 | | 1.62423735e−009 |
| C2 | | −2.90322074e−014 |
| C3 | | −1.28032707e−018 |
| C4 | | −8.13073474e−024 |
| C5 | | −2.82547328e−028 |
| C6 | | −1.12054203e−032 |
| C7 | | 3.63330556e−037 |
| | SURFACE NO. 41 | |
| K | | 0.0000 |
| C1 | | −8.25877332e−010 |
| C2 | | −1.35293772e−014 |
| C3 | | −1.52207044e−019 |
| C4 | | −3.79513424e−024 |
| C5 | | 4.70194280e−029 |
| C6 | | 1.38778762e−033 |
| C7 | | 2.29251252e−038 |
| | SURFACE NO. 43 | |
| K | | 0.0000 |
| C1 | | −7.55685880e−010 |
| C2 | | 3.51491917e−015 |
| C3 | | −1.00447098e−019 |
| C4 | | −2.72274784e−024 |
| C5 | | 7.10036568e−029 |
| C6 | | 2.88999682e−033 |
| C7 | | −6.70709105e−038 |
| | SURFACE NO. 45 | |
| K | | 0.0000 |
| C1 | | −3.91274835e−009 |

TABLE 10-continued

| | |
|---|---|
| C2 | −3.25534545e−015 |
| C3 | 9.56631278e−019 |
| C4 | −3.12533946e−024 |
| C5 | 1.64402231e−028 |
| C6 | 3.02878298e−033 |
| C7 | −6.01532104e−038 |
| SURFACE NO. 48 | |
| K | 0.0000 |
| C1 | −5.54279925e−010 |
| C2 | 4.37404892e−014 |
| C3 | −2.36005962e−020 |
| C4 | 5.02991088e−024 |
| C5 | 1.62614899e−028 |
| C6 | −6.64121367e−034 |
| C7 | 1.69853177e−038 |
| SURFACE NO. 50 | |
| K | 0.0000 |
| C1 | 9.18566931e−010 |
| C2 | 2.34181695e−014 |
| C3 | −2.37718980e−019 |
| C4 | −4.99822008e−024 |
| C5 | 4.49770758e−029 |
| C6 | 1.89095883e−033 |
| C7 | −3.25678700e−038 |
| SURFACE NO. 54 | |
| K | 0.0000 |
| C1 | 4.98993424e−010 |
| C2 | 2.96497812e−014 |
| C3 | 7.13814561e−019 |
| C4 | 6.37411566e−023 |
| C5 | −9.87253699e−027 |
| C6 | 8.78681835e−031 |
| C7 | −3.08278753e−035 |

What is claimed is:

1. An optical system configured to project an object from an object plane of the optical system to an image plane of the optical system, the optical system comprising:
   a system diaphragm; and
   a plurality of optical elements which are arranged along an optical axis, the plurality of optical elements comprising:
     a first plurality of lenses; and
     a second plurality of lenses, the second plurality of lenses comprising a first meniscus lens and a second meniscus lens, the first and second meniscus lenses each having a concave surface facing the image plane,
   wherein the optical system is a microlithography projection optical system comprising a waist between the first and second plurality of lenses, the second plurality of lenses is positioned between the first plurality of lenses and the image plane, and the first meniscus lens is positioned between the system diaphragm and the waist,
   wherein the first and second meniscus lenses are positioned at a location in the second plurality of lenses where light projected from the object plane diverges.

2. The optical system of claim 1, wherein the second plurality of lenses further comprises a third meniscus lens.

3. The optical system of claim 2, wherein the third meniscus lens is positioned with a convex surface facing the image plane.

4. The optical system of claim 3, wherein the first, second, and third meniscus lenses are positioned adjacent each other with respect to the optical axis.

5. The optical system of claim 2, wherein the third meniscus lens is positioned between the image plane and the second meniscus lens, the second meniscus lens being positioned between the image plane and the first meniscus lens.

6. The optical system of claim 1, wherein the first and second meniscus lenses are positioned adjacent each other with respect to the optical axis.

7. The optical system of claim 1, wherein both the first and second meniscus lenses are positioned between the system diaphragm and the waist.

8. The optical system of claim 1, further comprising an adjustable diaphragm positioned at the system diaphragm and being configured to allow for adjustment of an aperture of the optical system.

9. The optical system of claim 1, wherein the system diaphragm is positioned between the first meniscus lens and the second meniscus lens.

10. The optical system of claim 1, wherein the second plurality of lenses includes a negative group positioned between the waist and the system diaphragm, the negative group having an effective curvature with a concave side directed towards the image.

11. The optical system of claim 10, wherein the negative group comprises at least one of the first and second meniscus lenses.

12. The optical system of claim 11, wherein the effective curvature of the negative group has a radius of curvature of $r_c$ whose ratio, $r_c/DB$, to the aperture diameter, DB, of the system diaphragm is in a range between approximately 0.8 and approximately 2.2.

13. The optical system of claim 1, wherein the first meniscus lens is a negative meniscus lens.

14. The optical system of claim 13, wherein the second meniscus lens is a negative meniscus lens.

15. The optical system of claim 1, wherein the optical system has an image side numerical aperture of 0.85 or more.

16. The optical system of claim 1, wherein the optical system is a dioptric optical system.

17. The optical system of claim 1, wherein the optical system is configured to project an object using radiation having a wavelength less than 260 nm.

18. The optical system to claim 1, wherein the optical system is configured to project an object using radiation having a wavelength of 248 nm, 193 nm, or 157 nm.

19. An optical system configured to project an object from an object plane of the optical system to an image plane of the optical system, the optical system comprising:
   a plurality of optical elements arranged along an optical axis of the optical system, the plurality of optical elements comprising:
     a first plurality of lenses; and
     a second plurality of lenses positioned between the first plurality of lenses and the image plane, the second plurality of lenses comprising a first meniscus lens and a second meniscus lens, the first and second meniscus lenses each having a concave surface facing the image plane,
   wherein the optical system is a microlithography projection optical system comprising a waist positioned between the first and second pluralities of lenses and the optical system comprises a pupil plane positioned between the first meniscus lens and the image plane,
   wherein the projection optical system has an image side numerical aperture of 0.85 or more.

20. The optical system of claim 19, wherein the second plurality of lenses includes a negative group positioned between the waist and the system diaphragm, the negative group having an effective curvature with a concave side directed towards the image.

21. The optical system of claim 19, wherein the effective curvature of the negative group has a radius of curvature of $r_c$ whose ratio, $r_c/DB$, to the aperture diameter, DB, of the system diaphragm is in a range between approximately 0.8 and approximately 2.2.

22. The optical system of claim 19, wherein the projection optical system is configured to project an object using radiation having a wavelength less than 260 nm.

23. An optical system configured to project an object from an object plane of the optical system to an image plane of the optical system, the optical system comprising:
   a plurality of optical elements arranged along an optical axis of the optical system, the plurality of optical elements comprising:
   a first plurality of lenses; and
   a second plurality of lenses positioned between the first plurality of lenses and the image plane, the second plurality of lenses comprising a first meniscus lens, a second meniscus lens, and a third meniscus lens, where the first and second meniscus lenses have a concave surface facing the image plane and are adjacent to each other with respect to the optical axis, and the first and third meniscus lenses are adjacent each other with respect to the optical axis,
   wherein the optical system is a microlithography projection optical system comprising a waist between the first and second plurality of lenses, the second plurality of lenses is positioned between the first plurality of lenses and the image plane,
   wherein the projection optical system has an image side numerical aperture of 0.85 or more.

24. The optical system of claim 23, wherein the second plurality of lenses includes a negative group positioned between the waist and a system diaphragm, the negative group having an effective curvature with a concave side directed towards the image.

25. The optical system of claim 24, wherein the effective curvature of the negative group has a radius of curvature of $r_c$ whose ratio, $r_c/DB$, to the aperture diameter, DB, of the system diaphragm is in a range between approximately 0.8 and approximately 2.2.

26. The optical system of claim 23, wherein the projection optical system is configured to project an object using radiation having a wavelength less than 260 nm.

27. An optical system configured to project an object from an object plane of the optical system to an image plane of the optical system, the optical system comprising:
   a system diaphragm; and
   a plurality of optical elements which are arranged along an optical axis, the plurality of optical elements comprising:
   a first plurality of lenses; and
   a second plurality of lenses, the second plurality of lenses comprising a first meniscus lens, a second meniscus lens and a third meniscus lens, the first and second meniscus lenses each having a concave surface facing the image plane,
   wherein the optical system is a microlithography projection optical system comprising a waist between the first and second plurality of lenses, the second plurality of lenses is positioned between the first plurality of lenses and the image plane, the first meniscus lens is positioned between the system diaphragm and the waist, the third meniscus lens is positioned with a convex surface facing the image plane, and the first, second, and third meniscus lenses are positioned adjacent each other with respect to the optical axis and wherein the optical system has an image side numerical aperture of 0.85 or more.

28. The optical system of claim 27, wherein the second plurality of lenses includes a negative group positioned between the waist and the system diaphragm, the negative group having an effective curvature with a concave side directed towards the image.

29. An optical system configured to project an object from an object plane of the optical system to an image plane of the optical system, the optical system comprising:
   a system diaphragm; and
   a plurality of optical elements which are arranged along an optical axis, the plurality of optical elements comprising:
   a first plurality of lenses; and
   a second plurality of lenses, the second plurality of lenses comprising a first meniscus lens and a second meniscus lens, the first and second meniscus lenses each having a concave surface facing the image plane,
   wherein the optical system is a microlithography projection optical system comprising a waist between the first and second plurality of lenses, the second plurality of lenses is positioned between the first plurality of lenses and the image plane, and the first meniscus lens is positioned between the system diaphragm and the waist,
   wherein the second plurality of lenses includes a negative group positioned between the waist and the system diaphragm, the negative group having an effective curvature with a concave side directed towards the image, where the effective curvature of the negative group has a radius of curvature of $r_c$ whose ratio, $r_c/DB$, to the aperture diameter, DB, of the system diaphragm is in a range between approximately 0.8 and approximately 2.2.

30. The optical system of claim 29, wherein the optical system has an image side numerical aperture of 0.85 or more.

31. An optical system configured to project an object from an object plane of the optical system to an image plane of the optical system, the optical system comprising:
   a system diaphragm; and
   a plurality of optical elements which are arranged along an optical axis, the plurality of optical elements comprising:
   a first plurality of lenses; and
   a second plurality of lenses, the second plurality of lenses comprising a first meniscus lens and a second meniscus lens, the first and second meniscus lenses each having a concave surface facing the image plane,
   wherein the optical system is a microlithography projection optical system comprising a waist between the first and second plurality of lenses, the second plurality of lenses is positioned between the first plurality of lenses and the image plane, and the first meniscus lens is positioned between the system diaphragm and the waist,
   wherein the optical system has an image side numerical aperture of 0.85 or more.

32. The optical system of claim 31, wherein the second plurality of lenses includes a negative group positioned between the waist and the system diaphragm, the negative group having an effective curvature with a concave side directed towards the image.

33. An optical system configured to project an object from an object plane of the optical system to an image plane of the optical system, the optical system comprising:
- a system diaphragm; and
- a plurality of optical elements which are arranged along an optical axis, the plurality of optical elements comprising:
- a first plurality of lenses; and
- a second plurality of lenses, the second plurality of lenses comprising a first meniscus lens and a second meniscus lens, the first and second meniscus lenses each having a concave surface facing the image plane,
- wherein the optical system is a microlithography projection optical system comprising a waist between the first and second plurality of lenses, the second plurality of lenses is positioned between the first plurality of lenses and the image plane, and the first meniscus lens is positioned between the system diaphragm and the waist,
- wherein the microlithography projection optical system is a single-waist projection optical system.

34. The optical system of claim 33, wherein the second plurality of lenses includes a negative group positioned between the waist and the system diaphragm, the negative group having an effective curvature with a concave side directed towards the image.

35. The optical system of claim 33, wherein the optical system has an image side numerical aperture of 0.85 or more.

* * * * *

UNITED STATES PATENT AND TRADEMARK OFFICE
CERTIFICATE OF CORRECTION

PATENT NO. : 7,339,743 B2  Page 1 of 1
APPLICATION NO. : 11/528379
DATED : March 4, 2008
INVENTOR(S) : Karl-Heinz Schuster It is certified that error appears in the above-identified patent and that said Letters Patent is hereby corrected as shown below:

Column 1, Line 48, delete "fulfil" insert --fulfill--.

Column 2, line 63, at the end of equation (2) insert --...--.

Column 6, line 31, delete "$\geqq$" insert --$\geq$--.

Column 11, line 10, at the end of equation (2) insert --...--.

Column 11, line 38, delete "µm" insert --nm--.

Column 11, line 41, delete "mk" insert --mλ--.

Signed and Sealed this

Sixteenth Day of December, 2008

JON W. DUDAS
*Director of the United States Patent and Trademark Office*